(12) United States Patent
Ushiyama

(10) Patent No.: US 6,720,660 B1
(45) Date of Patent: Apr. 13, 2004

(54) SEMICONDUCTOR DEVICE AND METHOD FOR MANUFACTURING THE SAME

(75) Inventor: Fumiaki Ushiyama, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/834,532

(22) Filed: Apr. 13, 2001

Related U.S. Application Data

(62) Division of application No. 09/469,852, filed on Dec. 22, 1999, now Pat. No. 6,245,659.

(30) Foreign Application Priority Data

Dec. 22, 1998 (JP) .......................................... 10-365191

(51) Int. Cl.$^7$ ............................................. H01L 23/48
(52) U.S. Cl. ..................... 257/774; 257/632; 257/741; 257/750; 257/758; 257/765
(58) Field of Search .......................... 257/48, 741, 750, 257/758, 765, 774, 632; 438/637, 638

(56) References Cited

U.S. PATENT DOCUMENTS

| | | | | |
|---|---|---|---|---|
| 4,985,373 A | * | 1/1991 | Levinstein et al. | 437/195 |
| 5,275,963 A | * | 1/1994 | Cederbaum et al. | 438/624 |
| 5,317,193 A | * | 5/1994 | Watanabe | 257/773 |
| 5,591,659 A | * | 1/1997 | Ema et al. | 438/241 |
| 5,717,240 A | * | 2/1998 | Kuriyama et al. | 257/370 |
| 5,856,706 A | * | 1/1999 | Lee | 257/644 |
| 6,077,773 A | * | 6/2000 | Lin | 438/637 |
| 6,229,214 B1 | * | 5/2001 | Jang | 257/763 |

* cited by examiner

*Primary Examiner*—George Eckert
*Assistant Examiner*—N. Drew Richards
(74) *Attorney, Agent, or Firm*—Hogan & Hartson, LLP

(57) ABSTRACT

A semiconductor device has a semiconductor substrate having a main surface including a first region and a second region, and an interlayer dielectric film formed over the first region and the second region. A bonding pad, a power source line, a test pattern or the like is formed in the first region, and a logic circuit, an analog circuit, a memory circuit or the like is formed in the second region. The interlayer dielectric film has a maximum thickness over the first region, and a thickness that is about 90–50% of the maximum thickness over the second region. The interlayer dielectric film defines a first through hole formed over the first region and a second through hole formed over the second region. An aperture area of the first through hole is greater than that of the second through hole. As a result, the range of the focus margin for forming the first through hole covers the range of the focus margin for forming the second through hole. Consequently, the focus margin for forming the second through hole is adopted as a focus margin for forming the first through hole and the second through hole.

67 Claims, 14 Drawing Sheets

Second Region    First Region

SEMICONDUCTOR DEVICE AND METHOD FOR MANUFACTURING THE SAME

This is a divisional of application Ser. No. 09/469,852 filed Dec. 22, 1999 now U.S. Pat. No. 6,245,659, allowed, which application is hereby incorporated by reference in its entirety.

BACKGROUND OF THE INVENTION

1. Field of the Invention

The present invention relates to a semiconductor device and a method for manufacturing the same.

2. Description of Related Art

Typically, a semiconductor device includes a semiconductor substrate, and an electronic element and a wiring that are formed over the main surface of the semiconductor substrate. The semiconductor device may include an interlayer dielectric film. A silicon oxide film is widely used as the interlayer dielectric film. A variety of methods are available for forming a silicon oxide film. For example, a silicon oxide film may be formed by reacting a silicon compound such as silane or the like with hydrogen peroxide by a CVD method (hereinafter referred to as "planarizing silicon oxide film"). For example, this method is described in Japanese Laid-open Patent Application HEI 9-102492. The planarizing silicon oxide film has an excellent planarization characteristic.

An interlayer dielectric film that includes a planarizing silicon oxide film may have variations in film thickness depending on locations on the main surface of the semiconductor substrate. For example, the variations occur due to the following reasons.

First, the main surface of the semiconductor substrate includes a region where wirings are formed with a high wiring density and a region wherein wirings are formed with a low wiring density. The thickness of the planarizing silicon oxide film formed over the high wiring density region is generally greater than the thickness of the planarizing silicon oxide film formed over the low wiring density region, due to a high level of flowability of the planarizing silicon oxide film.

Secondly, as the number of wiring layers increases, the number of interlayer dielectric films typically increases. Each interlayer dielectric film has variations in thickness. Such thickness variations in a plurality of the interlayer dielectric films may add up where the interlayer dielectric films overlap one another. As a result, the added thickness variation becomes greater at an upper level than at a lower level of the interlayer dielectric films. As the thickness variation becomes greater, a step difference in an interlayer dielectric film becomes larger.

When a through hole is formed in an interlayer dielectric film, a resist is used. A focus margin in exposure with respect to the resist becomes smaller when the step difference in the interlayer dielectric film becomes larger. As a result, the resolution at the resist lowers. As a consequence, a designed shape of a through hole may not be formed, or in the worst case, a through hole may not be formed at all.

SUMMARY OF THE INVENTION

It is an object of the present invention to provide a semiconductor device and a method for manufacturing a semiconductor device having a structure in which a focus margin does not become smaller.

A semiconductor device in accordance with one embodiment of the present invention has a semiconductor substrate having a main surface including a first region and a second region, and an interlayer dielectric film formed over the first region and the second region. In accordance with one embodiment of the present invention, for example, at least a bonding pad, a power source line, a test pattern or the like is formed in the first region. Also, in accordance with one embodiment of the present invention, at least a logic circuit, an analog circuit, a memory circuit or the like is formed in the second region.

The interlayer dielectric film defines a first through hole over the first region and a second through hole over the second region. In a preferred embodiment, the interlayer dielectric film has a maximum thickness over the first region. The interlayer dielectric film over the second region has a thickness that is about 90–50% of the maximum thickness. More preferably, the interlayer dielectric film over the second region has a thickness that is about 80–50% of the maximum thickness. In a preferred embodiment, an aperture area of the first through hole is greater than that of the second through hole.

It is noted that the problem of reduced focus margin is substantially eliminated when he film thickness over the second region is greater than about 90% of a maximum film thickness over the first region. When the film thickness over the second region is smaller than about 50%, the capacitance between metal wirings (such as for example, aluminum wirings) becomes large. As a result, the electrical characteristics of the semiconductor device deteriorate. Also, when a difference in the film thickness of the interlayer dielectric film becomes larger, an etching operation to form through holes becomes more difficult.

In a semiconductor device in accordance with one embodiment of the present invention, an aperture area of the first through hole is greater than an aperture area of the second through hole. As a result, a resist can be exposed with a focus margin for forming the second through hole. Thus, the focus margin does not become too small. The details will be described below with reference to preferred embodiments of the present invention.

In a semiconductor device in accordance with the present invention, a member that reduces the volume of the first through hole may preferably be formed in the first through hole due at least in part to the following reasons. An aperture area of the first through hole is greater than an aperture area of the second through hole. Accordingly, the first through hole has a greater volume than that of the second through hole. When conductive films are formed in the first and second through holes, the amount of the conductive film may not be sufficient to fill the first through hole, and there is a likelihood that the conductive film formed in the first through hole may have a recess. The recess results in a step difference in the interlayer dielectric film. The member formed in the first through hole can solve such problems as described above.

In one embodiment, the member may be formed as follows. The first through hole is formed by etching the interlayer dielectric film in a manner that the interlayer dielectric film in a column form remains at a center of the first through hole. The remaining column-like interlayer dielectric film occupies the internal space of the first through hole to serve as a member, In accordance with one embodiment of the present invention, a semiconductor device may be manufactured by the following method. A semiconductor device formed by a manufacturing method in accordance with the embodiment of the present invention has a semiconductor substrate having a main surface including a first region and a second region, and an interlayer dielectric film formed over the first region and the second region. The interlayer dielectric film defines a first through hole over the first region and a second through hole over the second region. The manufacturing method includes the following steps:

(a) The interlayer dielectric film is formed over the first region and the second region, wherein the interlayer dielectric film has a maximum thickness over the first region, and the interlayer dielectric film has a thickness that is 90–50% of the maximum thickness over the second region;

(b) A resist is formed over the interlayer dielectric film;

(c) The resist is exposed to light to form a pattern in the resist, wherein the resist pattern has an aperture for the first through hole and an aperture for the second through hole, wherein an area of the aperture for the first through hole is greater than an area of the aperture for the second through hole; and (d) The first through hole and the second through hole are formed by selectively etching the interlayer dielectric film using the resist as a mask.

The exposure in step (c) is conducted by, for example, one of a reduction projection exposure, an equal magnification (1:1) projection exposure and a scanning-type reduction projection exposure.

In a semiconductor device in accordance with one embodiment of the present invention, the interlayer dielectric film may preferably include a first silicon oxide film that is formed by a polycondensation reaction between a silicon compound and hydrogen peroxide.

In accordance with one embodiment of the present invention, step (a) may include step (e) in which the first silicon oxide film is formed by the reaction of a silicon compound with hydrogen peroxide using a CVD method. As a result, the formed interlayer dielectric film has an excellent planarization characteristic. It has been confirmed that the first silicon oxide film formed by this manufacturing method has a high flowability and a high self-planarization characteristic. This phenomenon is believed to take place due to the following mechanism. When a silicon compound and hydrogen peroxide are reacted by the CVD method, silanol is formed in a vapor phase, and the silanol deposits on the surface of the wafer to provide a film having a high flowability.

For example, when monosilane is used as a silicon compound, silanol is formed by reactions defined by formulas (1) and (1)' as follows:

$$SiH_4 + 2H_2O_2 \rightarrow Si(OH)_4 + 2H_2 \qquad \text{Formula (1)}$$

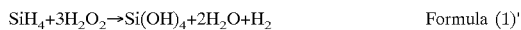

$$SiH_4 + 3H_2O_2 \rightarrow Si(OH)_4 + 2H_2O + H_2 \qquad \text{Formula (1)'}$$

Silanol formed by the reactions defined by Formulas (1) and (1)' becomes silicon oxide as a result of disconnection of water by a polycondensation reaction defined by Formula (2) as follows:

$$Si(OH)_4 \rightarrow SiO_2 + 2H_2O \qquad \text{Formula (2)}$$

The silicon compounds include, for example, inorganic silane compounds, such as, monosilane, disilane, $SiH_2Cl_2$, $SiF_4$ and the like, and organo silane compounds, such as, $CH_3SiH_3$, tripropyle-silane, tetraethylorthosilicate and the like.

Step (e) described above may preferably be conducted by a reduced pressure CVD method at temperatures of about 0–20° C. when the silicon compound is an inorganic silicon compound, and at temperatures of about 0–150° C. when the silicon compound is an organic silicon compound. If the temperature during the film-forming step is higher than the upper limit of the above-described temperature ranges, the polycondensation reaction defined by Formula (2) progresses excessively. As a result, the flowability of the first silicon oxide film lowers, and therefore it is difficult to obtain good planarization. On the other hand, if the temperature is lower than the lower limit of the above-described temperature ranges, the control of a film-forming apparatus becomes difficult. For example, water formed from the reaction adsorbs on surfaces within the chamber, and dew condensation occurs outside the chamber.

The first silicon oxide film may preferably be formed with a thickness that sufficiently covers step differences of the underlying layer. The minimum thickness of the first silicon oxide film depends on the height of protrusions and recesses of the underlying layer, and is preferably between about 300 and 1500 nm. If the film thickness of the first silicon oxide film exceeds over the above-described upper limit, cracks may occur due to stresses of the film itself.

The interlayer dielectric film may include any one of films other than the first silicon oxide film described above. Such films include, for example, SOG films (organic or inorganic) and silicon oxide films that are formed by reacting an organic silane, such as for example, TEOS with ozone or water.

In a semiconductor device in accordance with one embodiment of the present invention, the interlayer dielectric film may preferably include a second silicon oxide film that is located over the first silicon oxide film and serves as a cap layer.

In accordance with one embodiment of the present invention, step (a) may include step (f) in which a second porous silicon oxide film that serves as a cap layer is formed over the first silicon oxide film by reacting a silicon compound with at least one of oxygen and a compound including oxygen using a CVD method.

An impurity, such as, phosphorous, boron or the like, may preferably be added to the second porous silicon oxide film. More preferably, boron is added to the second porous silicon oxide film. As a result, the film can relieve stresses by weakening the molecular bonding force between Si and O molecules of the silicon oxide that forms the film. In other words, the layer becomes moderately soft but hard enough to resist to cracks. One important role of the second silicon oxide film is a function in which the impurity such as phosphorous contained in the silicon oxide film functions as a getter of mobile ions, such as alkali-ions which have a deteriorating effect on the element device-reliability characteristics. The impurity concentration of the impurity contained in the second silicon oxide film may preferably be about 1–6 weight %, in consideration of the gettering function and the stress relieving function of the film.

Also, the second silicon oxide film has a compression stress of about 100–600 MPa, and therefore has a function in preventing the generation of cracks due to an increased tensile stress that is caused in the first silicon oxide film when it undergoes polycondensation. Further, the second silicon oxide film has a function in preventing the first silicon oxide film from absorbing moisture.

The second silicon oxide film may preferably be formed by a plasma CVD method with a high frequency at temperatures of about 300–450° C. This process is effective in disconnecting water content from the first silicon oxide film.

The compound including oxygen that is used for forming the second silicon oxide film may be oxygen ($O_2$), and more preferably nitrogen monoxide (N₂O). By the use of nitrogen monoxide as a reactant gas, the nitrogen monoxide in the form of a plasma likely reacts with hydrogen bonds (—H) of the silicon compound that forms the first silicon oxide film. As a result, disconnection of gasification components (hydrogen, water) from the first silicon oxide film is promoted even while the second silicon oxide film is being formed.

Alternatively, the second silicon oxide film may be formed by a normal pressure CVD method at temperatures of about 300–550° C., instead of the plasma CVD method. In this case, ozone may preferably be used as a compound including oxygen that is utilized for forming the second silicon oxide film.

Also, before the second silicon oxide film is formed, the first silicon oxide film may preferably be exposed to an ozone atmosphere. Since ozone likely reacts with hydrogen bonds (—H) and hydroxyls (—OH) of the silicon compound that forms the first silicon oxide film, disconnection of hydrogen and water from the first silicon oxide film is promoted.

The thickness of the second silicon oxide film is preferably about 100 nm or greater in consideration of the planarization, prevention of cracks and the thickness of the interlayer dielectric film.

In one embodiment, a tapered through hole is formed in the interlayer dielectric film including the first silicon oxide film and the second silicon oxide film that is obtained in step (f). The tapered through hole has aperture diameters that gradually reduce from a mouth section to a bottom of the through hole. In the present embodiment, the etching speed for the first silicon oxide film is slightly slower than the etching speed for the second silicon oxide film, and the first silicon oxide film, and the second silicon oxide film are bonded well to each other at their boundaries. As a result, the through hole has a generally linear taper wall without step differences in the wall. An aluminum film or an aluminum alloy film can be filled in such a tapered through hole, for example, by sputtering, and thus a contact structure with an excellent conductivity is formed.

The through hole described above may be formed by an anisotropic dry etching. Also, a tapered through hole with a curved surface in an upper end section of the through hole may be formed by a combination of an isotropic wet etching and an anisotropic dry etching.

In a semiconductor device in accordance with one embodiment of the present invention, the interlayer dielectric film may preferably include a third silicon oxide film that serves as a base layer that is located under the first silicon oxide film.

The base layer has a passivation function that prevents migration of water and excess impurities from the first silicon oxide film to an underlying layer below the base layer (a main surface of a semiconductor substrate when there is no underlying layer). Also, the base layer has a function in increasing the cohesiveness between the first silicon oxide film and an underlying layer below the base layer (a main surface of a semiconductor substrate when there is no underlying layer).

When a gettering effect is required to get alkali-ions, an impurity, such as, phosphorous in the amount of about 1–6 weight % may be added to the third silicon oxide film that forms the base layer. Alternatively, for example, a PSG film containing phosphorous in the amount of about 1–6 weight % may be formed between the third silicon oxide film and the first silicon oxide film.

In accordance with one embodiment of the present invention, step (a) may include step (g) in which the third silicon oxide film that serves as a base layer is formed under the first silicon oxide film by reacting a silicon compound with at least one of oxygen and a compound including oxygen using a CVD method.

A tapered through hole may be formed in the interlayer dielectric film including the first silicon oxide film and the third silicon oxide film that is obtained in the step (g). The tapered through hole has aperture diameters that gradually reduce from a mouth section to a bottom of the through hole. The etching speed for the first silicon oxide film is slightly faster than the etching speed for the third silicon oxide film that forms the base layer. As a result, the through hole has an appropriate linear taper. An aluminum film or an aluminum alloy film can be filled in such a tapered through hole by sputtering, and thus a contact structure with an excellent conductivity is formed.

The through hole described above may be formed by an anisotropic dry etching. Also, a tapered through hole with a curved surface in an upper end section of the through hole may be formed by a combination of an isotropic wet etching and an anisotropic dry etching.

A semiconductor device in accordance with one embodiment of the present invention may preferably include a wiring formed on the interlayer dielectric film. In a preferred embodiment, the wiring may include a barrier layer formed on surfaces of the first through hole, the second through hole and the interlayer dielectric film, and a conductive film formed on a surface of the barrier layer.

The method for forming a semiconductor device in accordance with one embodiment of the present invention includes, after step (d), the steps of forming a barrier layer serving as a part of the wiring on surfaces of the first through hole, the second through hole and the interlayer dielectric film, and a conductive film on a surface of the barrier layer that forms a part of the wiring.

The conductive film may preferably be formed from aluminum or an alloy containing aluminum as a main component.

A semiconductor device that includes the wiring in accordance with the present invention may be formed by the following steps. A first aluminum film composed of aluminum or an alloy containing aluminum as a main component is formed in the first and second through holes at temperatures of about 200° C. or lower. Then, a second aluminum film composed of aluminum or an alloy containing aluminum as a main component is formed at temperatures of about 300° C. or higher.

The alloy containing aluminum as a main component may be a two-component or a three-component alloy containing at least one of copper, silicon, germanium, magnesium, cobalt and beryllium.

Other features and advantages of the invention will be apparent from the following detailed description, taken in conjunction with the accompanying drawings which illustrate, by way of example, various features of embodiments of the invention.

PREFERRED EMBODIMENTS

Figure 1:
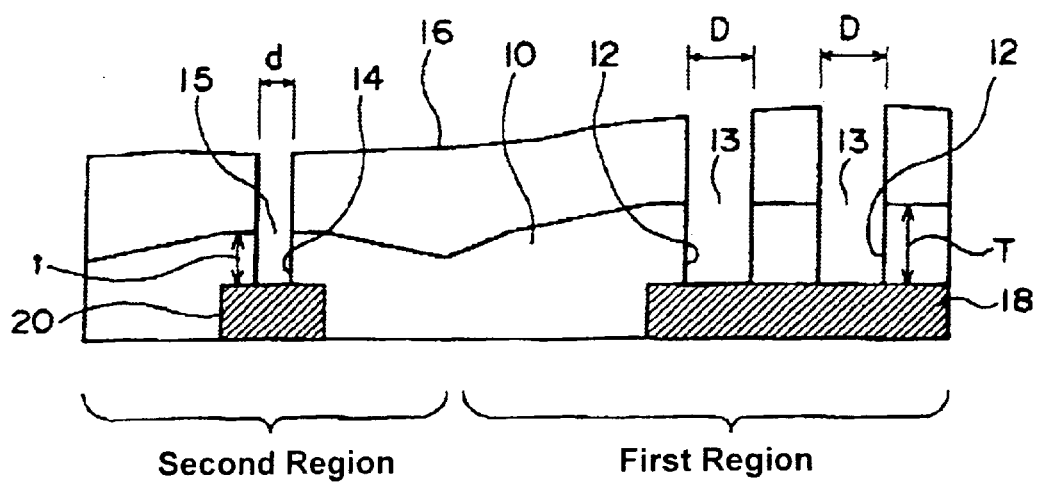
FIG. 1 is a cross-sectional view of a structure of a semiconductor device in accordance with a first embodiment of the present invention.

FIG. 1 is a cross-sectional view of a structure of a semiconductor device in accordance with a first embodiment of the present invention. A semiconductor substrate has a main surface, and includes a first region and a second region in the main surface. An aluminum wiring 18 is formed in the first region. The aluminum wiring 18 has a relatively large area. An aluminum wiring 20 is formed in the second region. The aluminum wiring 20 has a relatively small area.

An interlayer dielectric film 10 is formed on the main surface of the semiconductor substrate, and covers the aluminum wiring 18 and the aluminum wiring 20. The interlayer dielectric film 10 includes a film, such as, for example, a SOG film having a high flowability. The aluminum wiring 18 has a greater area than that of the aluminum wiring 20. As a result, the thickness T of the interlayer dielectric film 10 over the first region is greater than the thickness t of the interlayer dielectric film 10 over the second region. The thickness T is the maximum thickness of the interlayer dielectric film 10, and the thickness t is about 90–50% of the thickness T of the maximum thickness.

First through holes 12 are formed in the interlayer dielectric film 10 over the first region to expose the aluminum wiring 18. A second through hole 14 is formed in the interlayer dielectric film 10 over the second region to expose the aluminum wiring 20. In one embodiment, an aperture section 13 of the first through holes 12 is a circle. !The diameter D of the aperture section 13 is about 1.0 μm. An aperture section 15 of the second through hole 14 is also a circle. The diameter d of the aperture section 13 is about 0.5 μm. Accordingly, an area of the aperture section 13 of the first through hole 12 is larger than that of the aperture section 15 of the second through hole 14.

A resist 16 is formed on the interlayer dielectric film 10. The resist 16 functions as a mask for forming the through holes in the interlayer dielectric film 10. The resist 16 shown in the figure is in a developed state, after being exposed to light using a reduction projection exposure. As a result, the resist 16 has a predetermined designed pattern. The interlayer dielectric film 10 is selectively etched and removed, using the resist 16 as a mask. As a result, the first through holes 12 and the second through hole 14 are formed in the interlayer dielectric film 10.

Figure 2:
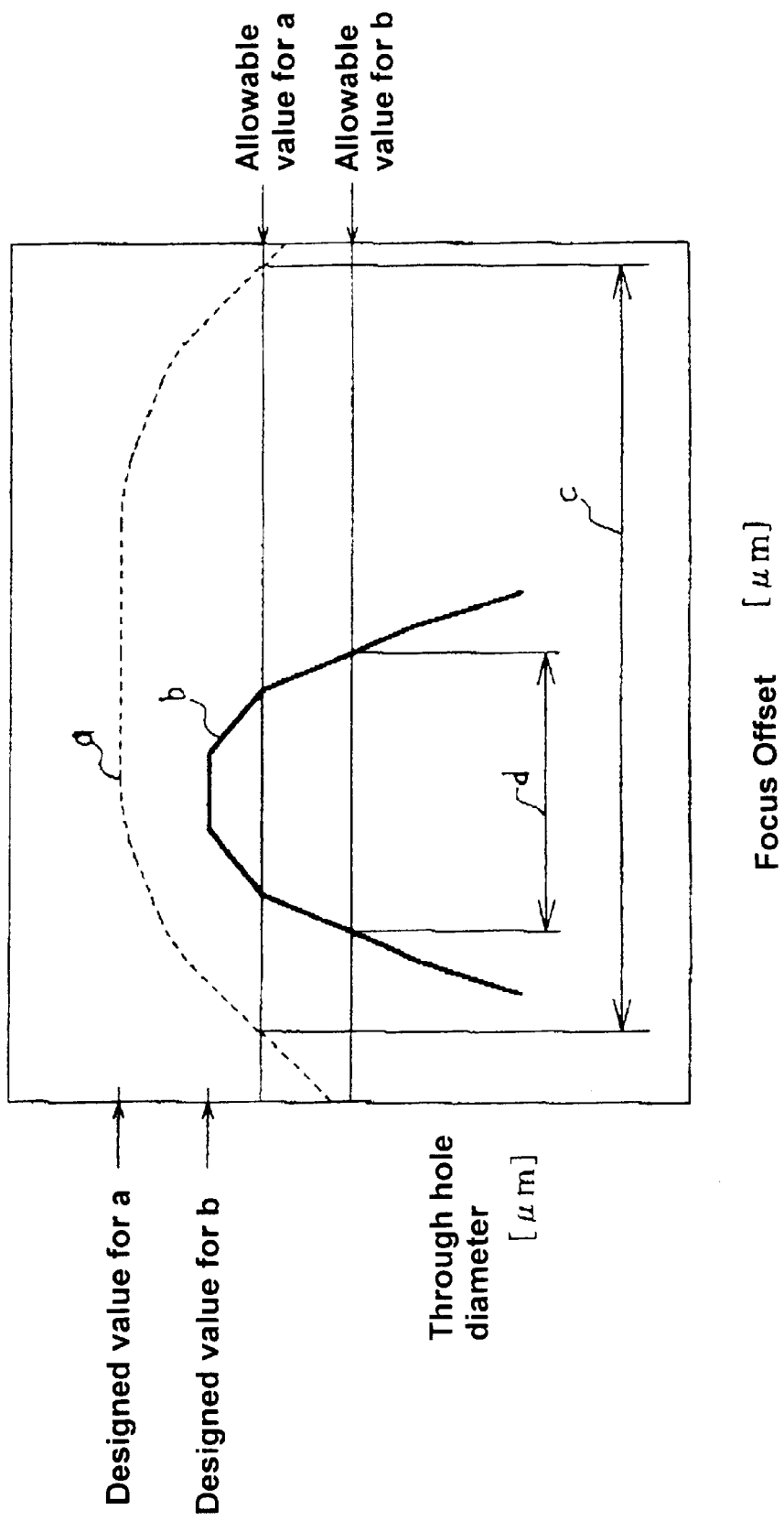
FIG. 2 is a graph showing relations between focus offsets and diameters of through holes in the semiconductor device shown in FIG. 1.

FIG. 2 is a graph showing relations between focus offsets (focus deviations) and diameters of the through holes in the semiconductor device shown in FIG. 1. A broken line marked by reference "a" represents such relations when the first through hole 12 is formed. A solid line marked by reference "b" represents such relations when the second through hole 14 is formed. A tolerance value is a permissible difference between an actual aperture diameter of a through hole and a predetermined value. Normally, a tolerance value is 10% smaller than a designed value.

Reference "c" represents a focus margin available when forming the first through hole 12. Reference "d" represents a focus margin available when forming the second through hole 14.

Due to a step difference in the interlayer dielectric film 10 that is caused by a difference in the thickness of the interlayer dielectric film 10, the range of the focus margin "c" and the range of the focus margin "d" in the figure are deviated from each other. However, the aperture section 13 of the first through hole 12 is larger than the aperture section 15 of the second through hole 14. As a result, the range of the focus margin "c" includes the range of the focus margin "d". Therefore, the focus margin "d" is adopted as a focus margin for forming the first through hole 12 and the second through hole 14.

Figure 3:
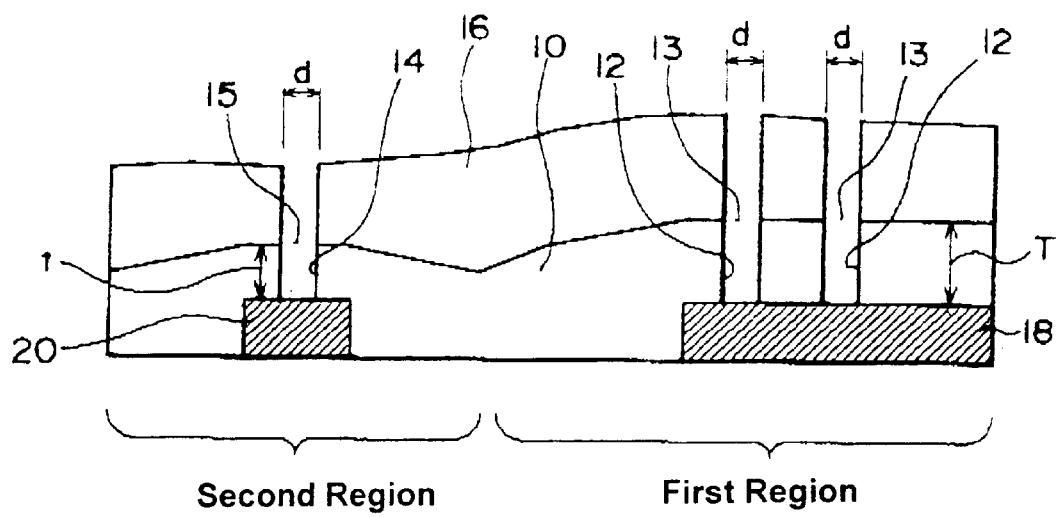
FIG. 3 is a cross-sectional view of a structure of a semiconductor device that is compared to the semiconductor device shown in FIG. 1.

FIG. 3 shows a cross-sectional view of a structure of a semiconductor device. This semiconductor device is a comparison example that is compared to the semiconductor device shown in FIG. 1. The same reference numbers refer to structural elements that correspond to those of the semiconductor device shown in FIG. 1. The diameter d (0.5 μm) of an aperture section 13 of the first through hole 12 is the same as the diameter d of an aperture section 15 of the second through hole 14. Accordingly, the aperture section 13 of the first through hole 12 and the aperture section 15 of the second through hole 14 have the same cross-sectional area. In this respect, the comparison sample differs from the semiconductor device of the first embodiment of the present invention.

Figure 4:
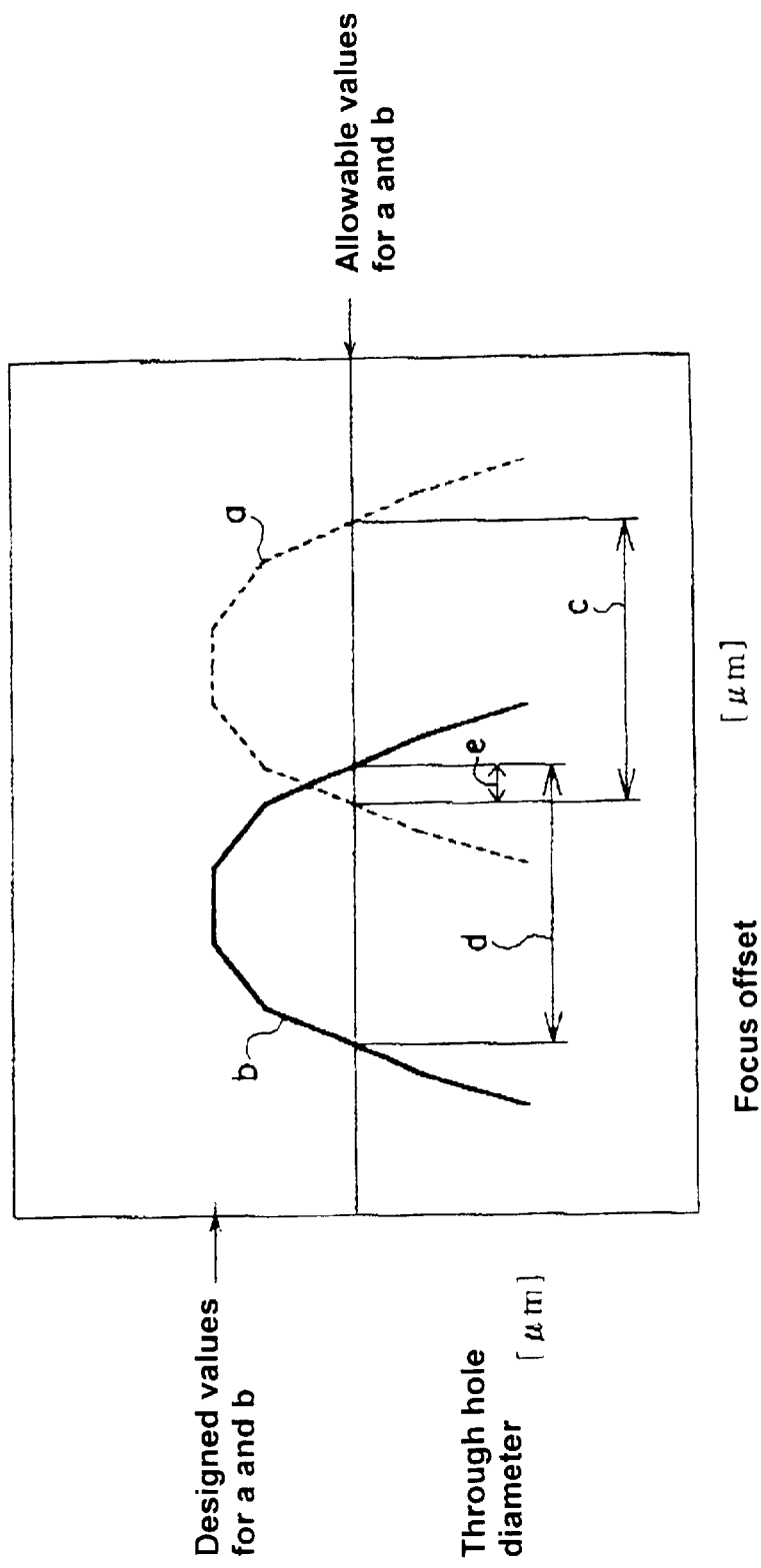
FIG. 4 is a graph showing relations between focus offsets and diameters of through holes in the semiconductor device shown in FIG. 3.

FIG. 4 is a graph showing relations between focus offsets (focus deviations) and diameters of the through holes in the semiconductor device shown in FIG. 3. A broken line marked by reference "a" represents such relations when the first through hole 12 is formed. A solid line marked by reference "b" represents such relations when the second through hole 14 is formed. Reference "c" represents a focus margin available when forming the first through hole 12. Reference "d" represents a focus margin available when forming the second through hole 14.

Due to a step difference in the interlayer dielectric film 10 that is caused by a difference in the thickness of the interlayer dielectric film 10, the range of the focus margin "c" and the range of the focus margin "d" are deviated from each other. The aperture section 13 of the first through hole 12 has the same area as that of the aperture section 15 of the second through hole 14. As a result, neither the range of the focus margin "c" nor the range of the focus margin "d" is included by the other. Instead, the range of the focus margin "c" overlaps the range of the focus margin "d". Therefore, a margin (e) corresponding to an overlapped area between the focus margin "c" and the focus margin "d" can be used as a focus margin for forming the first through hole 12 and the second through hole 14.

As is clear from the above, in accordance with the first embodiment of the present invention, the focus margin available for forming the first through hole 12 and the second through hole 14 is greater than that required for the comparison sample.

Figure 5:
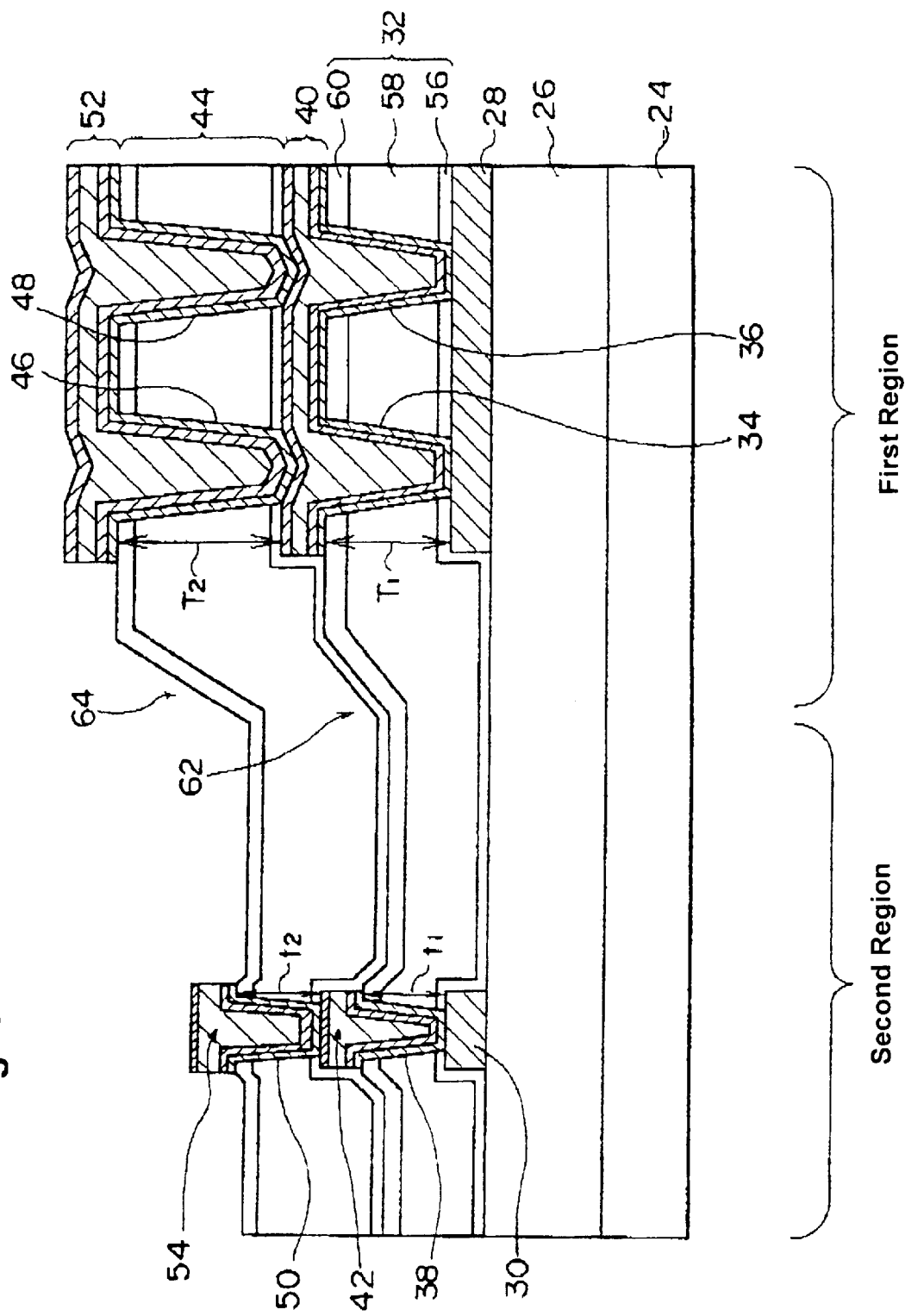
FIG. 5 is a cross-sectional view of a structure of a semiconductor device in accordance with a second embodiment of the present invention.

FIG. 5 is a cross-sectional view of a structure of a semiconductor device in accordance with a second embodiment of the present invention. A semiconductor substrate 24 has a main surface that includes a first region and a second region. A metal wiring layer is formed in the first region in which a relatively large pattern for power line, bonding pads and the like is formed. Another metal wiring layer is formed in the second region in which a relatively isolated pattern for logic circuits and the like is formed.

An interlayer dielectric film 26 is formed on the main surface of the semiconductor substrate 24. First metal wiring layers 28 and 30 are formed on the interlayer dielectric film 26. The first metal wiring layer 28 is located in the first region. The first metal wiring layer 30 is located in the second region.

An interlayer dielectric film 32 is formed over the interlayer dielectric film 26 and covers the first metal wiring layers 28 and 30. The interlayer dielectric film 32 has a three-layer structure.

More specifically, a third silicon oxide film 56 serving as a base layer is located at the bottom of the three-layer structure. A first silicon oxide film 58 is located on the third silicon oxide film 56. The first silicon oxide film 58 is formed by a polycondensation reaction between a silicon compound and hydrogen peroxide. A second silicon oxide film 60 serving as a cap layer is located on the first silicon oxide film 58.

As described above, the first silicon oxide film 58 itself has a high level of flowability. As a result, the first silicon oxide film 58 is relatively thin over the first metal wiring layer 30 where segments of the pattern are separated relatively far from one another. When the interlayer dielectric film 32 has a maximum thickness $T_1$ over the first metal wiring layer 28, the interlayer dielectric film 32 over the first metal wiring layer 30 has a thickness $t_1$ that is about 90–50% of the thickness $T_1$. Due to the thickness difference, a step difference 62 is created in the interlayer dielectric film 32 along a border between the first region and the second region.

First through holes 34 and 36 that reach the first metal wiring layer 28 are formed in the interlayer dielectric film 32. A second through hole 38 that reaches the first metal wiring layer 30 is formed in the interlayer dielectric film 32. An aperture area of each of the first through holes 34 and 36 is greater than an aperture area of the second through hole 38.

Second metal wiring layers 40 and 42 are formed on the interlayer dielectric film 32. The first metal wiring layer 28 and the second metal wiring layer 40 are electrically connected to each other by a conductive film, such as, an aluminum film that fills the first through holes 34 and 36. The first metal wiring layer 30 and the second metal wiring layer 42 are electrically connected to each other by a conductive film, such as, an aluminum film that fills the second through hole 38.

An interlayer dielectric film 44 is formed over the interlayer dielectric film 32 and covers the second metal wiring layers 40 and 42. The interlayer dielectric film 44 has substantially the same structure as that of the interlayer dielectric film 32.

Tho first silicon oxide film is relatively thin over the second metal wiring layer 42 where pattern segments of the pattern are relatively isolated from one another. When the interlayer dielectric film 44 has a maximum thickness $T_2$ over the second metal wiring layer 40, the interlayer dielectric film 44 over the second metal wiring layer 42 has a thickness $t_2$ that is about 90–50% of the thickness $T_2$. Due to the thickness difference, a step difference 64 is created in the interlayer dielectric film 44 along a border between the first region and the second region. As described above, the interlayer dielectric film 32 also has a thickness difference. There may be an area where the thickness difference in the interlayer dielectric film 44 is added to the thickness difference in the interlayer dielectric film 32. In such an area, the thickness difference in the interlayer dielectric film 44 is greater than the thickness difference in the interlayer dielectric film 32. The larger the thickness difference becomes, the greater the step difference becomes in the interlayer dielectric film.

First through holes 46 and 48 that reach the second metal wiring layer 40 are formed in the interlayer dielectric film 44. A second through hole 50 that reaches he second metal wiring layer 42 is formed in the interlayer dielectric film 44. An aperture area of each of the first through holes 46 and 48 is greater than an aperture area of the second through hole 50.

Third metal wiring layers 52 and 54 are formed on the interlayer dielectric film 44. The second metal wiring layer 40 and the third metal wiring layer 52 are electrically connected to each other by a conductive film 40 including an aluminum film that fills the first through holes 46 and 48. The second metal wiring layer 42 and the third metal wiring layer 54 are electrically connected to each other by a conductive film 52 including an aluminum film that fills the second through hole 50.

The semiconductor device in accordance with the second embodiment of the present invention includes three interlayer dielectric films (interlayer dielectric films 26, 32 and 44). However, the semiconductor device in accordance with the second embodiment of the present invention may have more than three interlayer dielectric films.

Next, a method for manufacturing a semiconductor device in accordance with the second embodiment of the present invention will be described below. FIGS. 6–10 show cross sections of the semiconductor device at several successive stages in a manufacturing process.

Figure 6:
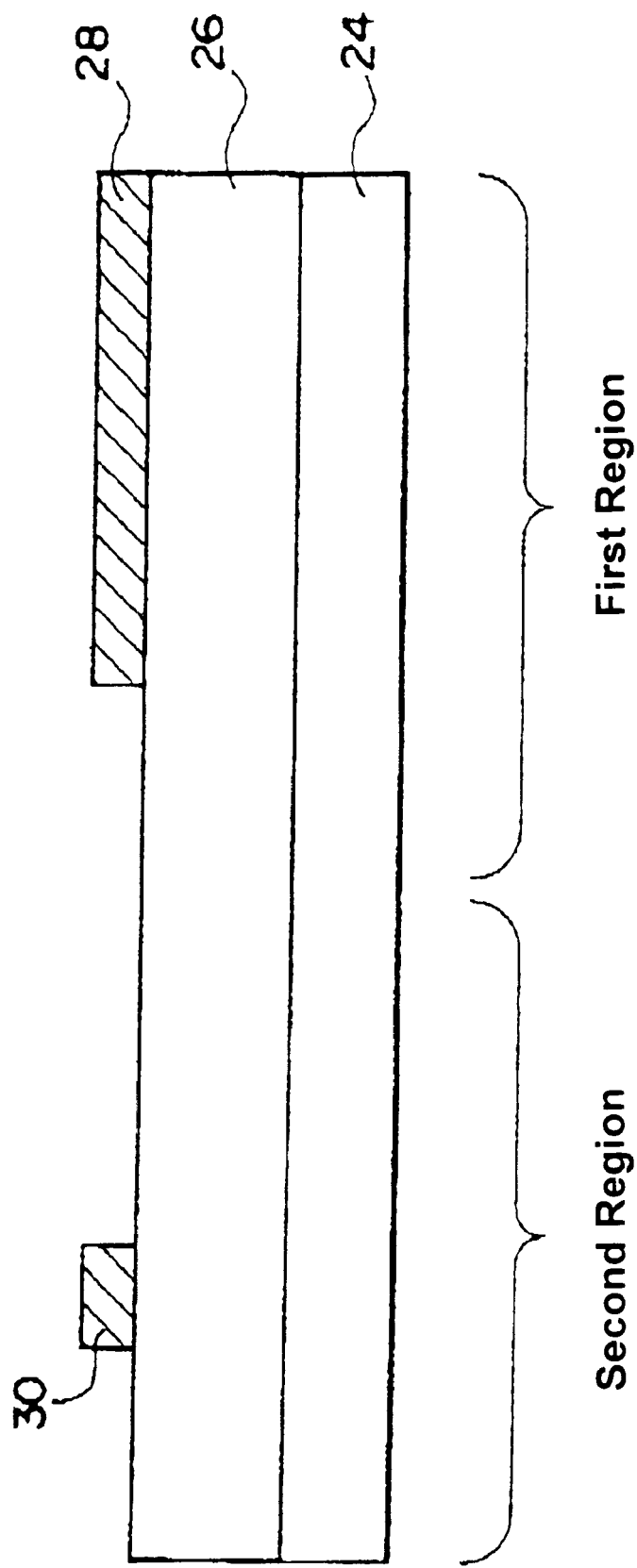
FIG. 6 shows a first step in a process for making a semiconductor device in cross section in accordance with the second embodiment of the present invention.

FIG. 6 shows a silicon substrate 24 having a main surface and an electronic element such as a MOS field-effect transistor formed on the main surface. For example, an interlayer dielectric film 26 composed of a dielectric film, such as, a silicon oxide film, is formed on the main surface of the silicon substrate 24 by a CVD method. Well-known film forming conditions can be employed in forming the interlayer dielectric film 26. The interlayer dielectric film 26 may have a single-layer structure or a multiple-layer structure.

First metal wiring layers 28 and 30 composed of, for example, aluminum films are formed on the interlayer dielectric film 26 by, for example, a sputtering method. The first metal wiring layers 28 and 30 may have a single-layer structure or a multiple-layer structure.

Figure 7:
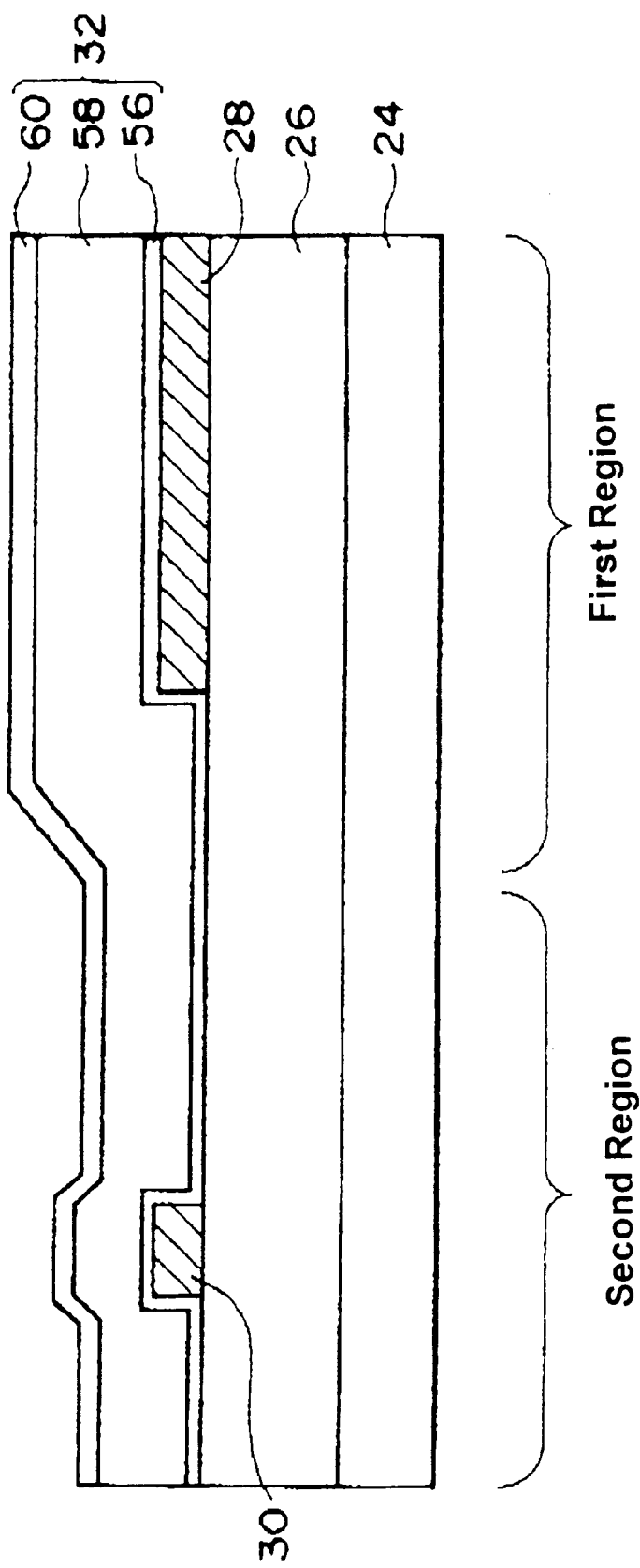
FIG. 7 shows a second step in the process for making the semiconductor device in cross section in accordance with the second embodiment of the present invention.

As shown in FIG. 7, a third silicon oxide film 56 having a film thickness of about 50–200 nm is formed by a reaction between tetraethylorthosilicate (TEOS) and oxygen at temperatures of about 300–500° C. utilizing a plasma CVD method. The silicon oxide film 56 does not have cuspings and does not oxidize the first metal wiring layers 28 and 30. The silicon oxide film 56 has a greater insulation, a slower etching speed against a hydrogen fluoride solution, and a higher density than a film that is grown from $SiH_4$.

As shown in FIG. 7, a first silicon oxide film 58 is formed by a CVD method through a reaction between $SiH_4$ and $H_2O_2$ using nitrogen gas as a carrier under a reduced pressure of about $2.5 \times 10^2$ Pa or lower in accordance with a preferred embodiment, and more preferably about $0.3 \times 10_2$ – $2.0 \times 10_2$ Pa. The first silicon oxide film 58 has a film thickness that is greater than at least a step difference in the third silicon oxide film 56. In other words, the first silicon oxide film 58 is formed to have a film thickness that sufficiently covers a step difference in the underlying film. A maximum film thickness of the first silicon oxide film 58 is determined such that cracks are not generated in the film. For example, the film thickness of the first silicon oxide film 58 is preferably greater than a step difference in the underlying layer to achieve an optimum planarization, and may preferably be in a range between about 300 nm and about 1500 nm.

Film formation temperature of the first silicon oxide film 58 depends on its flowability during the film formation thereof. A high film formation temperature lowers the flowability of the film and deteriorates the planarization. Accordingly, in a preferred embodiment, the film formation temperature is set at about 0–20° C., and more preferably at about 0–10° C.

The flow quantity of $H_2O_2$ is not particularly restricted to a specified level. However, for example, the concentration ratio of $H_2O_2$ may preferably be set at about 55–65 volume %, and the quantity of $H_2O_2$ is about twice or more as that of $SiH_4$. In one embodiment, for example, the flow quantity of $H_2O_2$ is preferably set at a gas flow rate ranging from about 100 to 1000 SCCM (Standard Cubic Centimeter Minute).

The first silicon oxide film 58 formed in this step is in the form of silanol polymer, has a high level of flowability and a high level of self-planarization characteristic. Also, the first silicon oxide film 58 has a high level of moisture absorption capability due to numerous amounts of hydroxyl (—OH) contained therein.

Next, the substrate is left in the chamber under a reduced pressure for about 30–120 seconds to remove some water content from the first silicon oxide film 58. Then, a plasma CVD method is successively conducted with the presence of $SiH_4$, $PH_3$ and $N_2O$ gases at temperatures of about 300–450° C. at high frequencies of about 200–600 kHz. As a result, the gases react with one another and form a PSG film (second silicon oxide film) 60 having a film thickness of about 100–600 nm, as shown in FIG. 7. In a preferred embodiment, the second silicon oxide film 60 is successively formed after film formation of the first silicon oxide film 58 in consideration of high moisture absorption capability of the first silicon oxide film 58. Alternatively, the second silicon oxide film 60 may be formed after the first silicon oxide film 58 is reserved in an atmosphere that does not contain water.

The second silicon oxide film 60 needs to be porous such that gasification components, such as water hydrogen and the like, contained in the first silicon oxide film 58 are readily and thoroughly removed in an anneal treatment that is later performed. Accordingly, the second silicon oxide film 60 is preferably formed by a plasma CVD method at a frequency of about 1 MHz or lower, and more preferably at a frequency of about 200–600 kHz, and at temperatures of about 450° C. or lower, and more preferably at temperatures of about 300–400° C. Also, in a preferred embodiment, the second silicon oxide film 60 contains an impurity such as phosphorous. When the second silicon oxide film 60 contains such an impurity, the second silicon oxide film 60 becomes more porous, with the result that stresses of the film are alleviated, and the film obtains a gettering effect with respect to alkali-ions. The level of concentration of the impurity is determined in consideration of the gettering effect and resistance to stresses. For example, when phosphorous is added as an impurity, the concentration level thereof may preferably be set at about 2–6 weight %.

Also, $N_2O$ is used as a compound containing oxygen in a plasma CVD method. The use of $N_2O$ promotes separation of hydrogen bonds in the first silicon oxide film 58. As a result, gasification components such as water and hydrogen contained in the first silicon oxide film 58 are removed more securely.

This film thickness of the second silicon oxide film 60 is determined in consideration of its role of adjusting the required thickness of the interlayer dielectric film and the function of $N_2O$ plasma that promotes separation of hydrogen bonds. In a preferred embodiment, the second silicon oxide film 60 may have a film thickness of about 100 nm or greater, and more preferably a film thickness of about 200–600 nm.

Referring to FIG. 7, an anneal treatment is conducted in a nitrogen atmosphere at temperatures of about 350–500° C. By this anneal treatment, the first silicon oxide film 58 and the second silicon oxide film 60 are densified and have good insulation and water-resistance characteristics. When the annealing temperature is set at 350° C. or higher, polycondensation reaction of silanol in the first silicon oxide film 58 is almost perfectly completed, such that water and hydrogen contained in the film are sufficiently discharged and the film is densified. When the annealing temperature is set at 500° C. or lower, aluminum films that form the first metal wiring layers 28 and 30 are not deteriorated. The annealing temperature is preferably set as high as allowable. This is because (1) the insulation capability of the interlayer dielectric film is improved and (2) the interlayer dielectric film becomes more resistive to deteriorating effects of heat treatments that are performed at later stages.

In the anneal treatment, the wafer temperature is elevated continuously or in stages in order to reduce effects of thermal strains against the first silicon oxide film 58. For example, a ramping anneal is preferably conducted for the anneal treatment.

When the interlayer dielectric film 32 is located between the main surface of the silicon substrate 24 and the first metal wiring layers 28 and 30 (at a position where the interlayer dielectric film 26 is formed), the anneal treatment can be conducted at temperatures higher than about 500° C. because an aluminum wiring is not present when the anneal treatment is conducted.

By the above-described steps, the interlayer dielectric film 32 including the first silicon oxide film 58, the second silicon oxide film 60 and the third silicon oxide film 56 is completed.

Figure 8:
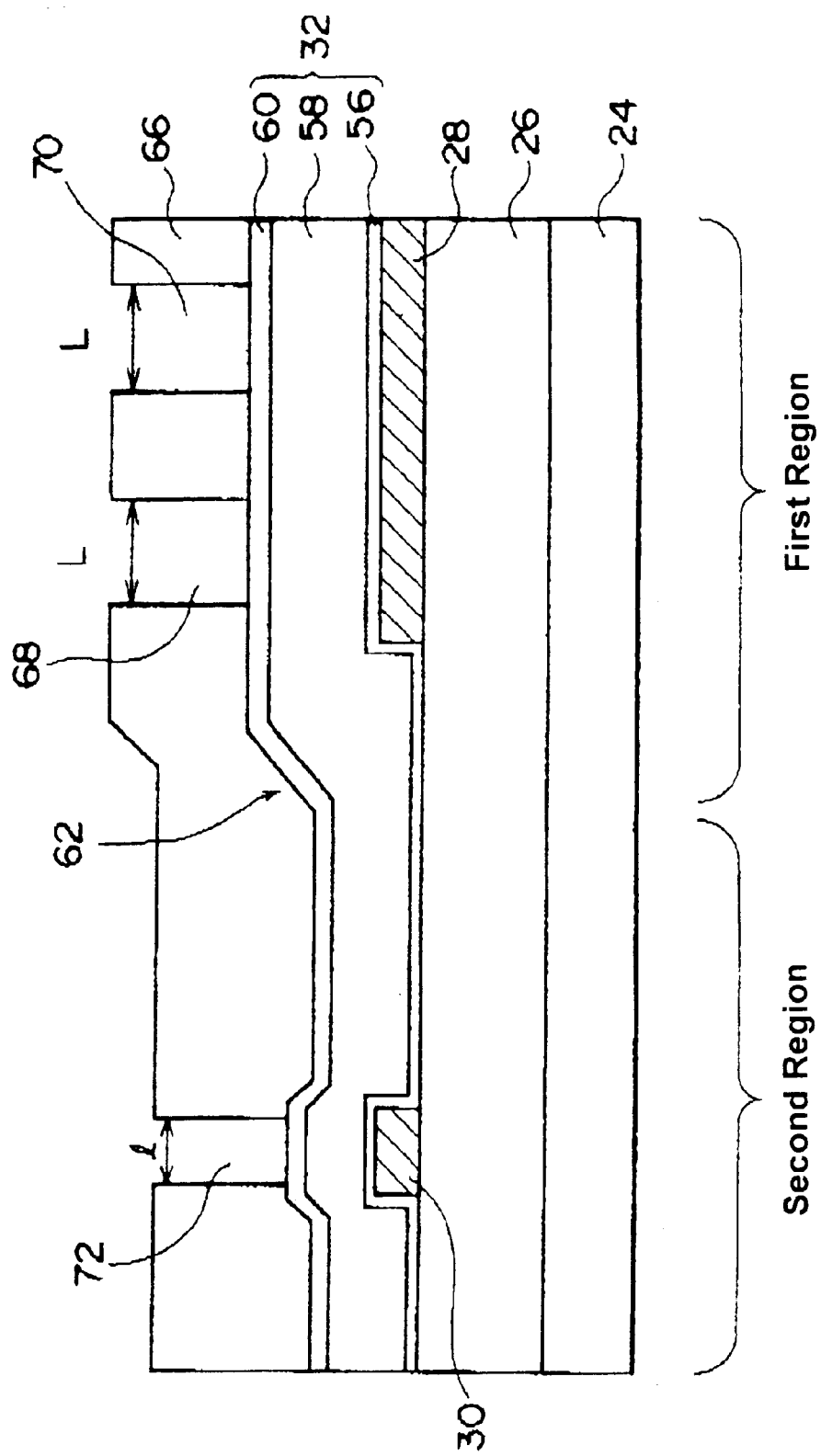
FIG. 8 shows a third step in the process for making the semiconductor device in cross section in accordance with the second embodiment of the present invention.

As shown in FIG. 8, a resist 66 is formed on the interlayer dielectric film 32. Then, the resist 66 is selectively exposed by reduction projection exposure. The resist 66 is developed to form a pattern, having removed portions 68, 70 and 72 in which the resist 66 is partially removed. The removed portions 68 and 70 are located in the first region. First through holes are formed under the removed portions 68 and 70. The removed portion 72 is located in the second region. A second through hole is formed under the removed portion 72.

Each of the removed portions 68 and 70 is generally square as seen in the plan view (in which the length of each edge L is about 0.4–2.0 μm). The removed portion 72 is generally square (in which the length of each edge 1 is about 0.2–1.0 μm). The length L is greater than the length 1. As a result, an area of each of the removed portions 68 and 70 is greater than an area of the removed portion 72 as seen in the plan view.

Figure 9:
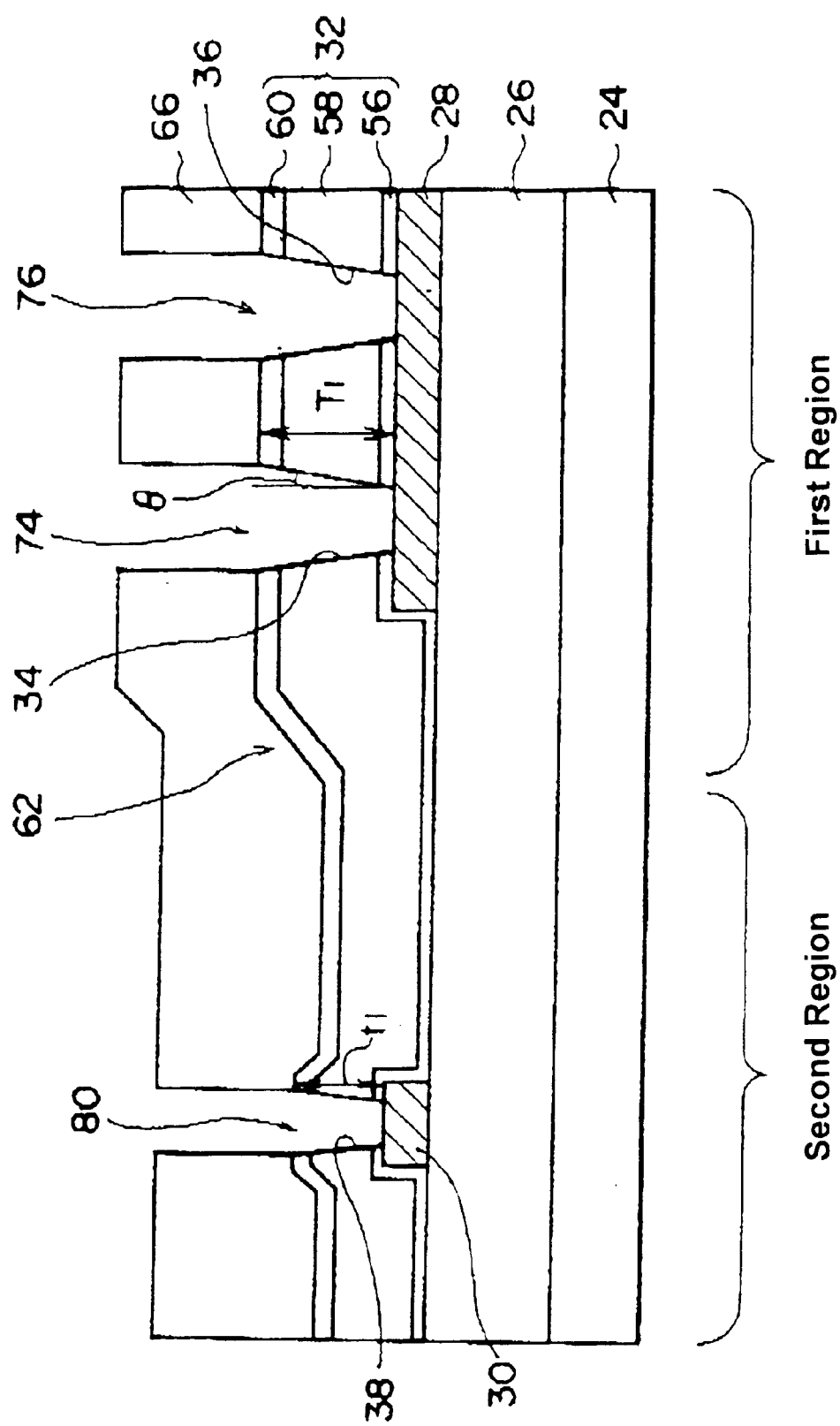
FIG. 9 shows a fourth step in the process for making the semiconductor device in cross section in accordance with the second embodiment of the present invention.

Referring to FIG. 9, the first silicon oxide film 58, the second silicon oxide film 60 and the third silicon oxide film 56 that form the interlayer dielectric film 32 are selectively anisotropically etched using a reactive ion etcher containing $CHF_3$ and $CF_4$ as main gases. As a result, first through holes 34 and 36 are formed in the first region and a second through hole 38 is formed in the second region.

Figure 13:
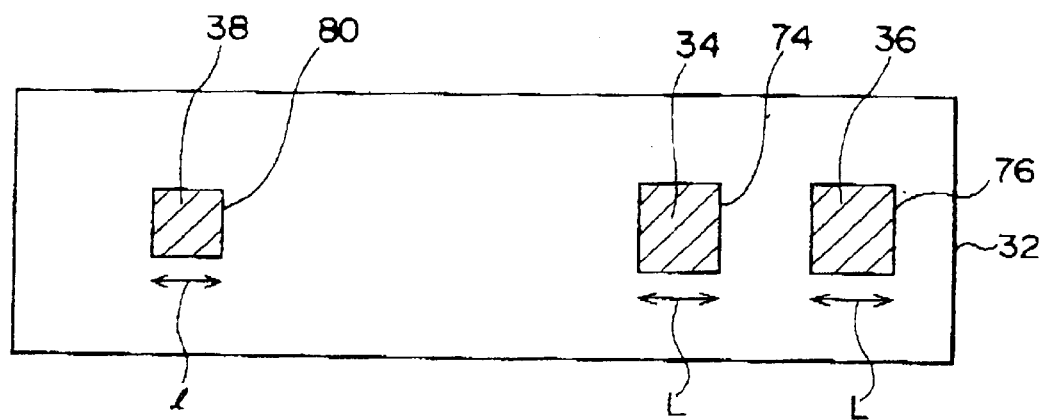
FIG. 13 is a plan view of through holes of a semiconductor device in accordance with the second embodiment of the present invention.

FIG. 13 is a plan view of the structure shown in FIG. 9 in which the resist 66 is removed. The first through holes 34 and 36 and the second through hole 38 are shaded with hatching. Aperture sections 74 and 76 of the first through holes 34 and 36 are generally square (in which each edge has the same length as the length L). An aperture section 80 of the second through hole 38 is generally square (in which each edge has the same length as the length 1). Accordingly, an area of each of the opening sections 74 and 76 is greater than an area of the opening section 80.

The opening sections 74, 76 and 80 may be in a circular shape or a polygonal shape. In such instances, corresponding sections in the mask pattern are formed in a circular shape or a polygonal shape.

Referring to FIG. 9, each of the first through holes 34 and 36 and the second through hole 38 has a tapered side surface in which cross sections of the through holes linearly reduce from their opening sections toward bottom sections of the through holes. Taper angle θ may vary depending on etching conditions. However, for example, the taper angle θ is 5–15 degree. Such tapered through holes are formed by the following reasons. First, the first silicon oxide film 58, the second silicon oxide film 60 and the third silicon oxide film 56 present generally the same etching speed. However, the first silicon oxide film 58 presents an etching speed slightly slower than that of the second silicon oxide film 60. Secondly, boundary surfaces of the silicon oxide films are bonded to each other very well. Aluminum films can be deposited very well in the tapered through holes, as described below.

Dry etching speeds for the silicon oxide films measured by the inventors of the present invention are shown below. The dry etching is performed with a power being 800W, a pressure being 20 Pa and etchant gases containing $CF_4$, $CHF_3$ and He in a ratio of 1:2:9.

| First silicon oxide film 58 | 525 nm/min |
| Second silicon oxide film 60 | 550 nm/min |
| Third silicon oxide film 56 | 500 nm/min |

Heat treatment including a degasification process will be described below.

Lamp heating (heat treatment A) is conducted in a lamp chamber under base pressures of $1.5 \times 10^{-4}$ Pa or lower, at temperatures of about 150–350° C., and more preferably at temperatures of about 150–250° C., for about 30–60 seconds. Then, in another chamber where argon gas is introduced at pressures of about $1 \times 10^{-1}$–$15 \times 10^{-1}$ Pa, a heat treatment (degasification step: heat treatment B) is conducted at temperatures of about 300–500° C. for about 30–300 seconds to thereby perform a degasification process.

In this process, first, the entire wafer including its rear surface and side surface is heat treated in the heat treatment A to remove water content that adheres to the wafer, as a primary object.

Then, in the heat treatment B, mainly, gasification components (H, $H_2O$) in the first silicon oxide film 58 that form the interlayer dielectric film 32 are removed. As a result, the generation of gasification components from the interlayer dielectric film 32 can be prevented during film formation of a barrier layer and an aluminum film conducted in later steps.

In accordance with one embodiment of the present invention, a wetting layer such as a Ti film may be formed. Such a film may preferably contain some ten atom % of gasification components (O, H, $H_2O$, N) in solid solution. Accordingly, removal of the gasification components in the interlayer dielectric film 32 before forming the wetting layer is very effective in successfully forming aluminum films in the first through holes 34 and 36 and the second through hole 38. Unless the gasification components are sufficiently removed from the interlayer dielectric film 32 below the wetting layer, the gasification components in the interlayer dielectric film 32 may be discharged and enter the wetting layer at a film formation temperature for forming the wetting layer (normally 300° C. or higher). Further, the gases are separated from the wetting layer when an aluminum film is formed and come out into a boundary between the wetting layer and the aluminum film, causing deteriorating effects on cohesiveness and fluidity of the aluminum layer.

Figure 10:
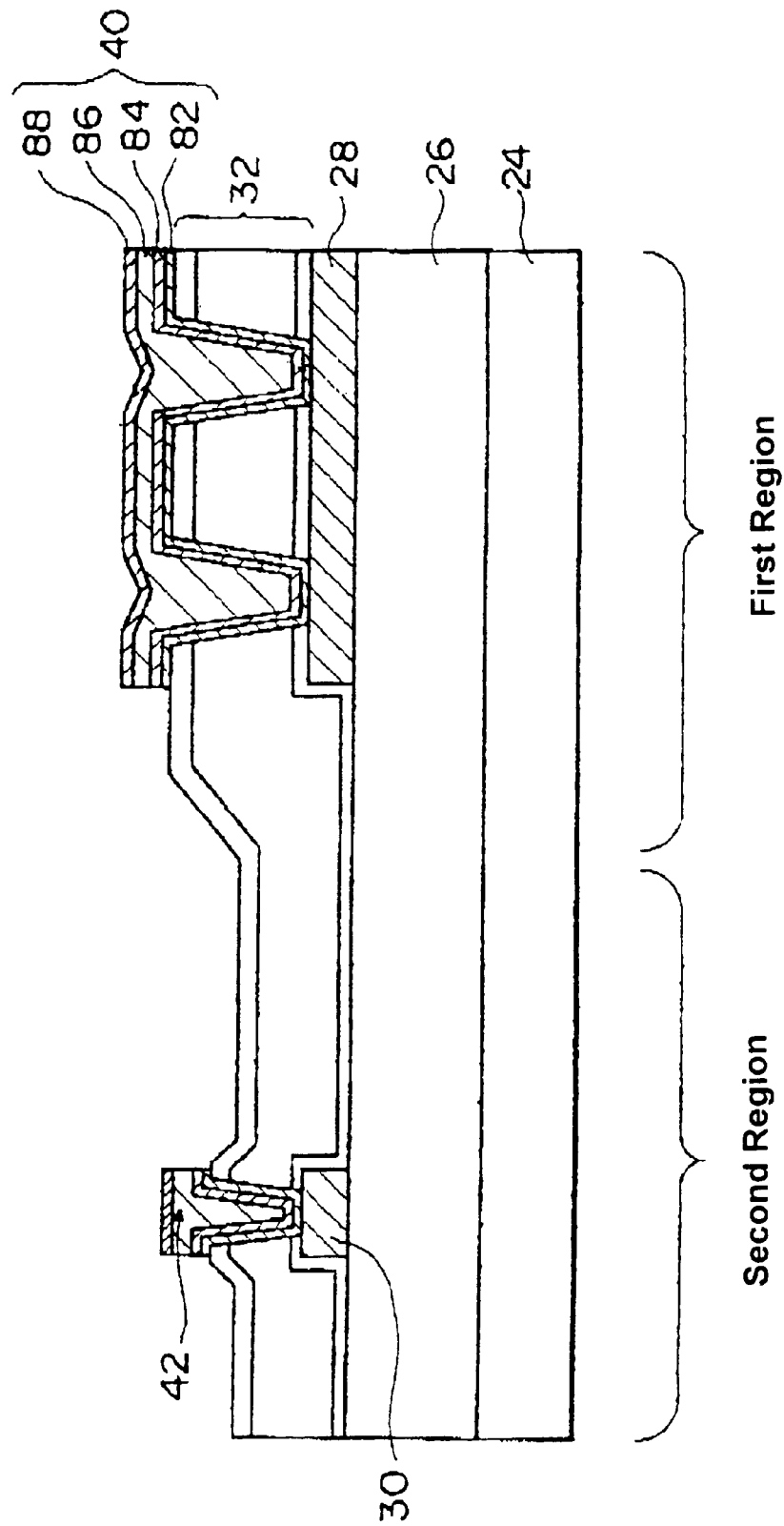
FIG. 10 shows a fifth step in the process for making the semiconductor device in cross section in accordance with the second embodiment of the present invention.

Referring to FIG. 10, a titanium film serving as a wetting layer 82 is formed to a film thickness of about 20–70 nm by a sputtering method. The sputtering is conducted at temperatures ranging between about 200 and 450° C. depending on the film thickness.

Referring to FIG. 10, before cooling the wafer, a heat treatment (heat treatment C) is conducted first in a lamp chamber under base pressures of about $1.5 \times 10^{-4}$ Pa or lower at temperatures of about 150–250° C. for about 30–60 seconds to remove substances such as water adhered to the substrate. Then, before an aluminum film is formed, the substrate temperature is lowered to about 100° C. or lower, and more preferably to the normal temperature –50° C. This cooling process is important for lowering the temperature of the substrate which has been heated up through the heat treatment C. For example, the wafer is placed on a stage equipped with a water cooling function to cool the wafer to a predetermined temperature.

By cooling the wafer in the manner described above, the amount of gases which may be discharged from the interlayer dielectric film 32, the wetting layer 82 and the entire surface of the wafer at the time of film formation of a first aluminum film 84 is reduced to a minimum. As a result, this prevents deteriorating effects of the gases which may be adsorbed on the boundary between the wetting layer 82 and the first aluminum film 84 to thereby damage their coverage and cohesiveness.

Referring to FIG. 10, first, a first aluminum film 84 is formed by sputtering aluminum containing 0.2–1.0 weight % of copper at a high speed at temperatures of about 200° C. or lower, and more preferably at about 30–100° C. to a film thickness of about 150–300 nm. Then, the substrate temperature is elevated to about 420–460° C. in the same chamber, and aluminum similarly containing copper is sputtered at low speed to form a second aluminum film 86 having a film thickness of about 300–600 nm. In this film formation step, the level of "high speed" for film formation of the aluminum films may vary depending on the film forming condition and design specifications of a device to be manufactured. However, in this embodiment, the term "high speed" refers to sputtering speeds of about 10 nm/second or faster, and the term "low speed" refer to sputtering speeds of about 3 nm/second or slower.

Figure 11:
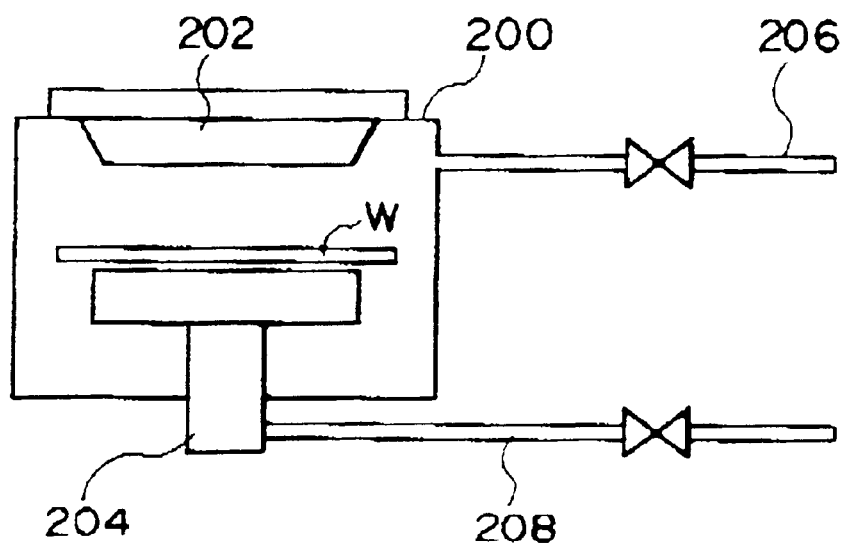
FIG. 11 schematically shows an example of a sputter apparatus used for the process for making the semiconductor device in accordance with the second embodiment of present invention.

FIG. 11 schematically shows an example of a sputter apparatus that is used to form the first and second aluminum films 84 and 86. The sputter apparatus has a chamber 200, a target 202 functioning also as an electrode and an electrode 204 functioning also as a stage. A substrate (wafer) W to be processed is mounted on the electrode 204. A first gas supply channel 206 is connected to the chamber 200, and a second gas supply channel 208 is connected to the electrode 204. Both of the gas supply channels 206 and 208 supply argon gas. The temperature of the wafer W is controlled by a gas supplied through the second gas supply channel 208. An exhaust system (not shown) may be provided to exhaust gasses from the chamber 200.

Figure 12:
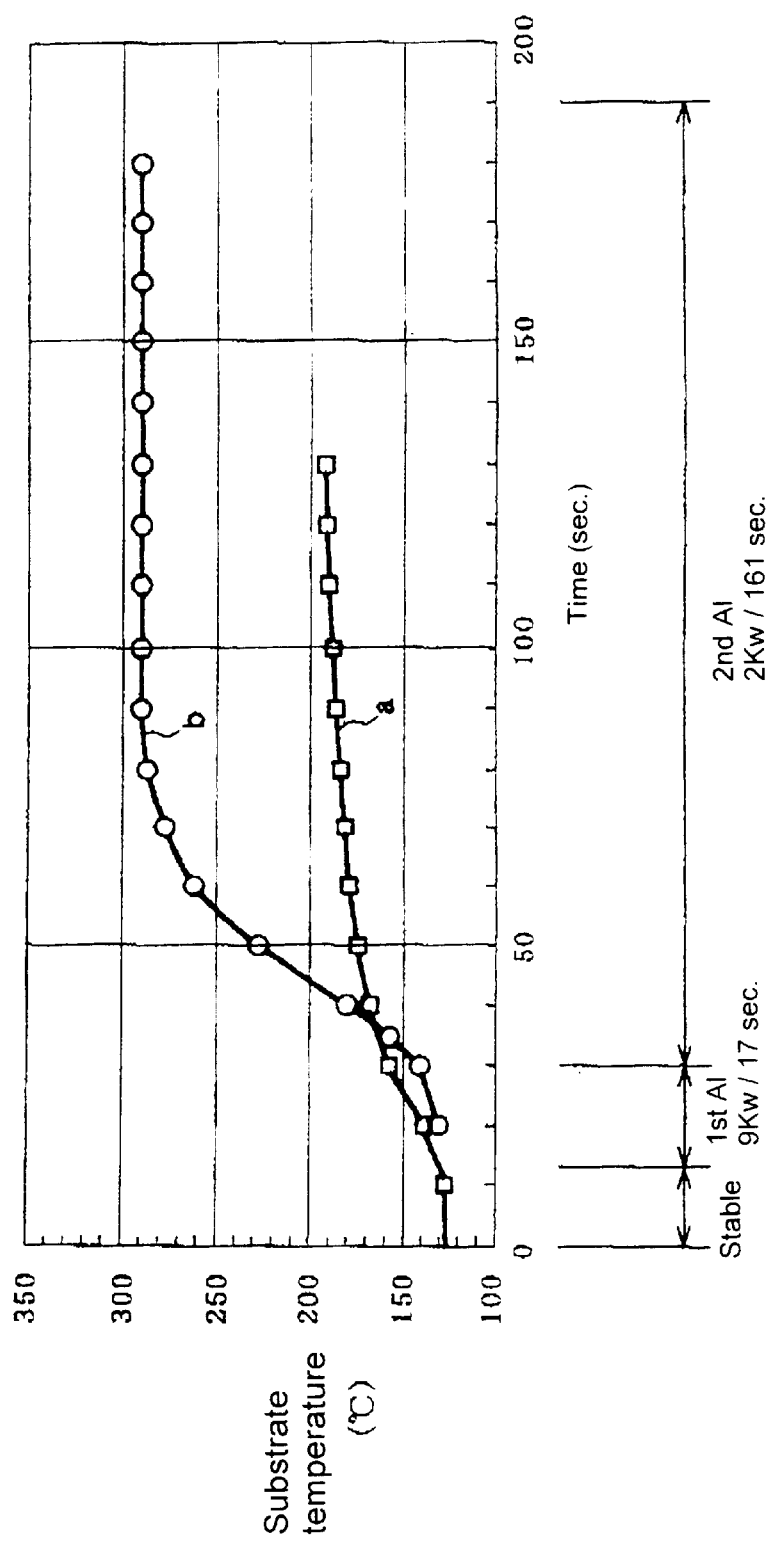
FIG. 12 shows relations between elapsed time and substrate temperatures when the substrate temperature is controlled using the sputter apparatus shown in FIG. 11.

One example for controlling the substrate temperature by the sputter apparatus is illustrated in FIG. 12. In FIG. 12, elapsed time is presented along the axis of abscissa, and substrate (wafer) temperatures are presented along the axis of ordinate. A line marked by reference "a" represents changes in the substrate temperature when the stage 204 of the sputter apparatus is set at 350° C. A line marked by reference "b" represents changes in the substrate temperature when the temperature of the stage 204 is increased by supplying high temperature argon gas through the second gas supply channel 208 into the chamber.

For example, the substrate temperature is controlled as follows. The stage 204 is pre-heated and its temperature is set at a film-forming temperature for forming the second aluminum film (at 350–500° C.). When the first aluminum film is formed, the substrate temperature is gradually increased by the heat from the stage 240 without gas supply from the second gas supply channel 208, as indicated by the line marked by reference "a" shown in FIG. 12. When the second aluminum film is formed, the substrate temperature is controlled to rapidly elevate by supplying heated gas through the second gas supply channel 208, and to be stabilized at a predetermined temperature level, as indicated by the line marked by reference "b" shown in FIG. 12.

In the example shown in FIG. 12, the temperature of the stage is set at 350° C., and the first aluminum film 84 is formed while the substrate temperature is set at 125–150° C., and immediately thereafter, the film formation of the second aluminum film 86 is conducted.

In the process of forming the aluminum films, control of power applied to the sputtering apparatus is important as well as control of film-forming speed and substrate temperature. In a preferred embodiment, the first aluminum film 84 is formed with a high power, and the second aluminum film 86 is formed with a lower power. However, the level of power may depend on the film-forming speed. Most importantly, the power is not reduced to zero when the power is switched from the high power to the lower power. If the power is reduced to zero, an oxide film is formed on the surface of the first aluminum film even under a reduced pressure, and the wettability of the second aluminum film with respect to the first aluminum film is lowered, and the bonding between the films is deteriorated. In other words, by continuously applying power, active aluminum is continuously supplied onto the surface of the aluminum film during the film formation, and formation of an oxide film is suppressed. The level of power is preferably set at about 5–10 kW for the high power and at about 300W –1 kW for the lower power, for example, under the temperature condition shown in FIG. 12. However, the level of power may vary depending on the sputtering apparatus and film forming conditions.

By successively forming the first aluminum film 84 and the second aluminum film 86 in the same chamber, the temperature and the power can be precisely controlled and stable 30 aluminum films are effectively formed at a lower temperature than the conventional method.

The thickness of the first aluminum film 84 is selected to be in an appropriate range in consideration of the capability of forming successive layers with good step coverage and the capability of controlling discharge of gasification components from the wetting layer 82 and the interlayer dielectric film 32 below the aluminum film 84. For example, the thickness may preferably be about 100–300 nm. The thickness of the second aluminum film 86 is determined by factors such as the size of a through hole and its aspect ratio. For example, the thickness of about 300–800 nm is necessary to cover a through hole having diameter of about 0.5 $\mu$m or smaller with aspect ratio of about 3.

Further, referring to FIG. 10, an antireflection film 88 with a film thickness of about 30–80 nm is formed by sputter-depositing titanium nitride (TiN) in another sputter chamber.

Then, a multilayer of the wetting layer 82, the first aluminum film 84, the second aluminum film 86 and the antireflection film 88 is selectively etched using an anisotropic dry etching apparatus with an anisotropic dry etcher mainly containing $Cl_2$ and $BCl_3$ gases. As a result, a second metal wiring layer 40 is formed in the first region and a second metal wiring layer 42 is formed in the second region.

In the second metal wiring layers 40 and 42 formed in this manner, it has been confirmed that the first through holes 34 and 36 and the second through hole 38 with an aspect ratio of 0.5–5.0 and the length of each edge being 0.2–2.0 $\mu$m is filled by the aluminum with good step coverage without creating voids. It is noted that even when a mask pattern is square, the shape of each of the removed portions 68, 70 and 72 may become a circle due to the refraction of light as seen in the plan view. In this case, the shape of each of the opening sections of the first through holes 34 and 36 and the second through hole 38 becomes a circle, as seen in the plan view. In this instance, each of the through holes has a circular opening with an opening diameter of 0.2–2.0 $\mu$m, and does not have a square opening with the length of each edge being 0.2–2.0 $\mu$m.

Referring to FIG. 5, the interlayer dielectric film 44 having substantially the same structure as that of the interlayer dielectric film 32 is formed over the interlayer dielectric film 32 to cover the second metal wiring layers 40 and 42. In a preferred embodiment, the interlayer dielectric film 44 is formed under the same conditions used for forming the interlayer dielectric film 32.

First through holes 46 and 48 for exposing the second metal wiring layer 40 and a through hole 50 for exposing the second metal wiring layer 42 are formed in the interlayer dielectric film 44. In a preferred embodiment, the first through holes 46 and 48 are formed under the same conditions used for forming the first through holes 34 and 36. Preferably, the second through hole 50 is formed under the same conditions used for forming the second through hole 38.

Third metal wiring layers 52 and 54 having substantially the same structure as that of the second metal wiring layers 40 and 42 are formed over the interlayer dielectric film 44. The third metal wiring layer 52 is located in the first region and is electrically coupled to the second metal wiring layer 40 through the first through holes 46 and 48. The third metal wiring layer 54 is located in the second region and is electrically coupled to the second metal wiring layer 42 through the through hole 50.

As shown in FIG. 9, the thickness $T_1$ of the interlayer dielectric film 32 in the first region is greater than the thickness $t_1$ of the interlayer dielectric film 32 in the second region.

As a result, a step difference 62 is created along a border between the first region and the second region.

In accordance with the second embodiment, an area of each of the opening sections 74 and 76 of the first through holes 34 and 36 is greater than an area of the opening section 80 of the second through hole 38. As a result, when the resist 66 is exposed, a focus margin for forming the second through hole 38 is adopted as a focus margin for forming the first through holes 34 and 36 and the second through hole 38. Accordingly, in accordance with the second embodiment, a greater focus margin is available compared to a focus margin available when forming first through holes and a second through hole that have the same opening area. As a result, in accordance with the second embodiment, the resolution at the resist is prevented from lowering, and thus a through hole with a required shape can be formed.

When a bonding pad or a power line is formed in the first region, the following advantage is achieved. Namely, since a pattern for the bonding pad or the power line is relatively large, an area of an opening section of a through hole can be made relatively large without causing any problems in designing a semiconductor device.

In accordance with the second embodiment, the first silicon oxide film 58 that contains silanol is formed by a CVD method using $SiH_4$ and $H_2O_2$. As a result, the formed interlayer dielectric film 32 has an excellent planarization characteristic. Accordingly, process margins in processes including wiring layer processing are improved, and manufacturing quality and yield are improved.

In particular, when the interlayer dielectric film 32 is formed between the main surface of the silicon substrate 24 and the first metal wiring layers 28 and 30 (i.e., at a location where the interlayer dielectric film 26 is formed), the following effects are achieved. The interlayer dielectric film 32 is planarized at substantially lower temperatures compared to a reflow temperature in forming a conventional BPSG film. As a result, device characteristics against punch-through and junction leaks are improved, and further device miniaturization of devices with highly reliable contact structures is achieved. Also, it is advantageous in view of the manufacturing process.

In accordance with the second embodiment, at least a degasification process and a cooling process are conducted before sputtering aluminum films, and preferably, the aluminum films are continuously formed in the same chamber. As a result, contact holes having an aperture diameter of about 0.2 μm can be filled only with aluminum or an aluminum alloy, and therefore the device reliability and production yield are improved. Also, it has been confirmed that the aluminum films forming the contact section do not have partial precipitation of copper or abnormal growth of crystal grains, and are highly reliable in various aspects including migration and the like.

In the second embodiment, it is believed that the first and second aluminum films 84 and 86 are embedded well in the through holes due to the following reasons in addition to the reasons described above.

By performing the degasification process, water and nitrogen contained in the interlayer dielectric film 32 (the interlayer dielectric film 44) are gasified and sufficiently discharged. As a result, the generation of gases from the interlayer dielectric film 32 and the wetting layer 82 is prevented when the first aluminum films 84 and 86 are formed in later steps. As a consequence, the wetting layer 82 and the first aluminum film 84 can be formed with high coherency and therefore good step coverage.

The substrate temperature is set at a relatively low temperature that is 200° C. or lower when the first aluminum film 84 is formed. As a result, water and nitrogen contained in the interlayer dielectric film 32 and the wetting layer 82 are prevented from being discharged, with the result that the coherency of the first aluminum film 84 is further increased in addition to the effect provided by the degasification process.

Further, the first aluminum film 84 itself plays a role to restrict the generation of gasses from the underlying layers when the substrate temperature rises. As a result, the second aluminum film 86 can be formed at a relatively high temperature, and therefore flow and diffusion can be optimally conducted for the second aluminum film 86.

The present invention is not limited to the embodiments described above, and can be modified as follows.

FIG. 13 shows the first through holes 34 and 36 and the second through hole 38 in accordance with the second embodiment as described above.

Figure 14:
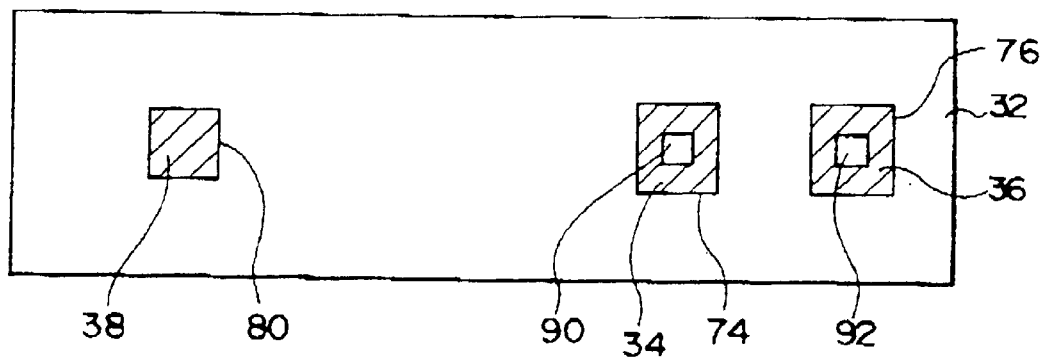
FIG. 14 is a plan view of through holes of a semiconductor device in a modification example of the second embodiment of the present invention.

However, the first through holes 34 and 36 may be modified in a manner shown in FIG. 14. In a preferred embodiment, volume-reducing members 90 and 92 are provided in central areas of the first through holes 34 and 36, respectively. Functions of the volume-reducing members 90 and 92 will be described below.

In accordance with the present embodiment, an area of each of the opening sections 74 and 76 of the first through holes 34 and 36 is greater than an area of the opening section 80 of the second through hole 38. As a result, each of the first through holes 34 and 36 has a greater volume than a volume of the second through hole 38. When conductive films are formed in the first through holes 34 and 36 and the second through hole 38, the amount of the conductive film may not be sufficient to fill the first through holes 34 and 36. Accordingly it is likely that the conductive films formed in the first through holes 34 and 36 may have recesses. The recesses result in step differences in the interlayer dielectric film 32. The volume-reducing members 90 and 92 have a function in reducing the volumes of the first through holes 34 and 36. Therefore, the volume-reducing members 90 and 92 formed in the first through holes 34 and 36 solve the problems described above.

The volume-reducing members 90 and 92 may be formed as follows. The first through holes 34 and 36 are formed by etching the interlayer dielectric film 32 in such a manner that the interlayer dielectric film 32 in the form of a column remains in a central area of each of the first through holes 34 and 36.

Secondly, in the second embodiment, when the second silicon oxide film 60 is formed by a plasma CVD method, nitrogen monoxide is used as a compound including oxygen. In an alternative embodiment, ozone may be used instead. The wafer may preferably be exposed to an ozone atmosphere before the second silicon oxide film 60 is formed.

Figure 15:
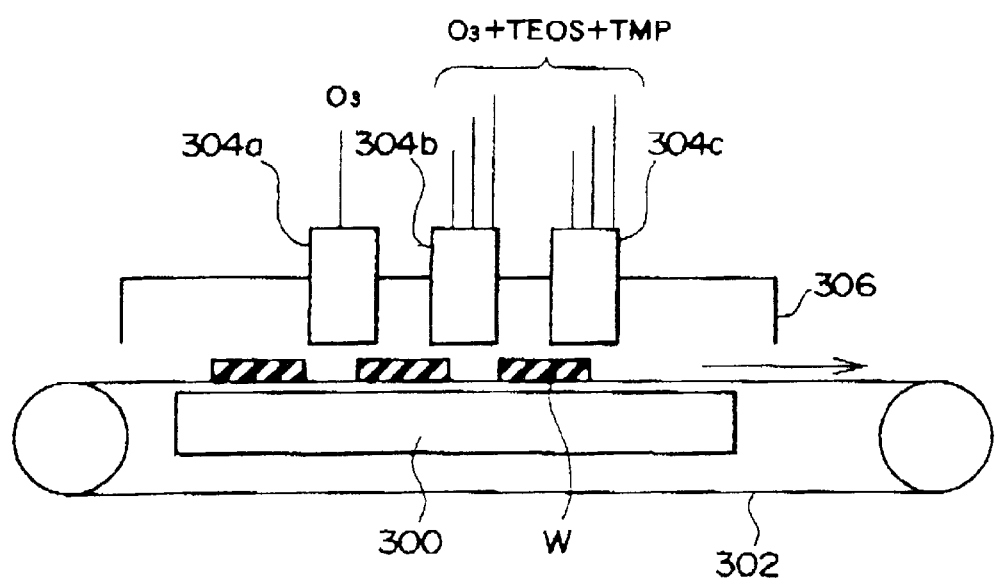
FIG. 15 schematically shows a belt furnace used for manufacturing the embodiments described.

For example, a belt furnace having a heater 300 shown in FIG. 15 is employed. A wafer W is placed on a conveyor belt 302 that is heated at about 400–500° C. by the heater 300 and conveyed at a predetermined transfer speed. In this instance, ozone is supplied through a first gas head 304a, such that the wafer W is transferred in an ozone atmosphere containing about 2–8 weight % of ozone for a time period of about 5 minutes or longer.

Then, ozone, TEOS and TMP (P(OCH$_3$)$_3$) are supplied through second and third gas heads 304b and 304c under generally normal pressure to form a PSG film (the second silicon oxide film) 60 to a film thickness of about 100–600 nm with a concentration of 3–6 weight % of phosphorous contained therein. Reference numeral 306 in FIG. 15 denotes a cover.

By using ozone instead of nitrogen monoxide, a silicon oxide film can be formed with TEOS by a normal pressure CVD method. Also, by the use of a belt furnace, film formation steps are successively and effectively conducted.

Also, by exposing the wafer W to an ozone atmosphere, it has been confirmed by a thermal desorption spectroscopy (TDS) and a Fourier-transform infrareds spectroscopy (FTIR) that the first silicon oxide film 58 has a low moisture absorption characteristic and contains a sufficiently low level water content. Further, the interlayer dielectric film 32 has a good planarization characteristic comparable to the one formed by using nitrogen monoxide as a reactive gas. Also, the first silicon oxide film 58 does not generate cracks.

Thirdly, in the second embodiment, a silicon oxide film as the third silicon oxide film 56 is formed by a plasma CVD method using TEOS. Other types of silicon oxide films may be used instead (in particular, when it is located at a position where the interlayer dielectric film 26 is formed). For example, as the third silicon oxide film 56, a film may be formed by a high-temperature reduced-pressure thermal CVD method using monosilane and nitrogen monoxide. The silicon oxide film thus formed faithfully follows the surface contour of the underlying layer, and has a high degree of coverage characteristic. The film thus formed is dense and therefore has a high passivation characteristic. Also, cracks are difficult to occur in the first silicon oxide film 58 even when anneal temperature is rapidly raised in an anneal treatment. Further, the thermal CVD method is advantageous because plasma damages are not caused. The term "high-temperature" refers to a temperature ranging from about 700 to about 850° C. in this embodiment.

Fourth, in the second embodiment, the interlayer dielectric film 32 consists of three layers of silicon oxide films. The present invention is not limited to this structure, and other silicon oxide films may be added. For example, a PSG film (with a concentration of 1–6 weight % of phosphorous contained therein) may be formed to a film thickness of about 100–300 nm by a plasma CVD method between the third silicon oxide film 56 and the first silicon oxide 58. It has been confirmed that the gettering function against mobile ions is further improved by inserting the PSG film. Also, by the insertion of the PSG film, internal stresses of the third silicon oxide film 56 that affect the first silicon oxide film 58 are reduced, and internal stresses of the first silicon oxide film 58 that affect the third silicon oxide film 56 are reduced.

For example, when the second silicon oxide film 60 is not insufficiently planarized, a thick silicon oxide film may be formed on the second silicon oxide film 60, and the thick silicon oxide film is further planarized by chemical-mechanical polishing (CMP).

The embodiments of the present invention are described above with reference to the interlayer dielectric film 32, the first through holes 34 and 36, the second through hole 38, and the second metal wiring layers 40 and 42. However, the same description is applicable to the interlayer dielectric film 44, the first through holes 46 and 48, the second through hole 50 and the second metal wiring layers 52 and 54.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device, comprising:
   a semiconductor substrate having a main surface including a first region and a second region;
   a first wiring on the semiconductor substrate in the first region; and
   an interlayer dielectric film formed over the first wiring and the first region and over the second region and defining a first through hole over the first wiring and a second through hole over the second region,
   wherein the interlayer dielectric film has a maximum thickness over the first region,
   wherein the interlayer dielectric film has a step difference in the interlayer dielectric film between the first region and the second region caused by the first wiring, and
   wherein an aperture area of the first through hole is greater than aperture area of the second through hole.

2. A semiconductor device according to claim 1, wherein the interlayer dielectric film includes a first silicon oxide film that is formed by polycondensation reaction between a silicon compound and hydrogen peroxide.

3. A semiconductor device according to claim 2, wherein the interlayer dielectric film includes a second silicon oxide film that is provided over the first silicon oxide film and defines a cap layer.

4. A semiconductor device according to claim 3, wherein the interlayer dielectric film includes a third silicon oxide film provided under the first silicon oxide film and defines a base layer.

5. A semiconductor device according to claim 1, wherein a wiring is formed on the interlayer dielectric film, the wiring including a barrier layer formed on surfaces of the first through hole, the second through hole and the interlayer dielectric film, and a conductive film formed on a surface of the barrier layer.

6. A semiconductor device according to claim 5, wherein the conductive film is formed from aluminum or an alloy containing aluminum as a main component.

7. A semiconductor device according to claim 1, wherein at least a bonding pad, a power source line or a test pattern is formed in the first region, and at least a logic circuit, an analog circuit or a memory circuit is formed in the second region.

8. A semiconductor device according to claim 1, wherein a member that reduces the volume of the first through hole is formed in the first through hole.

9. A semiconductor device according to claim 1, wherein a first height of the interlayer dielectric layer is greater than a second height of the interlayer dielectric layer,
   wherein the first height of the interlayer dielectric layer is the height of the interlayer dielectric layer in the first region, and
   wherein the second height of the interlayer dielectric layer is the height of the interlayer dielectric layer in the second region.

10. A semiconductor device according to claim 1, wherein the interlayer dielectric film has a thickness in the first region that is about 90–50% of the maximum thickness over the second region.

11. A semiconductor device according to claim 1, wherein the first wiring is disposed at least partly above the main surface of the semiconductor substrate in the first region.

12. A semiconductor device, comprising:
   a semiconductor substrate having a main surface including a first region and a second region;
   a first wiring disposed at least partly above the main surface of the semiconductor substrate in the first region;
   a second wiring on the semiconductor substrate in the second region;
   an interlayer dielectric film formed over the first wiring and the first region and over the second wiring and the second region,
   wherein the interlayer dielectric film defines a first through hole over the first wiring and a second through hole over the second wiring,
   wherein the interlayer dielectric film has a maximum thickness over the first region,
   wherein the interlayer dielectric film has a step difference in the interlayer dielectric film between the first region and the second region,
   wherein the first through hole has a first aperture area and the second through hole has a second aperture area, and
   wherein the first aperture area is greater than the second aperture area.

13. A semiconductor device according to claim 12, wherein the interlayer dielectric film includes a first silicon oxide film that is formed by polycondensation reaction between a silicon compound and hydrogen peroxide.

14. A semiconductor device according to claim 13, wherein the interlayer dielectric film includes a second silicon oxide film that is provided over the first silicon oxide film and defines a cap layer.

15. A semiconductor device according to claim 14, wherein the interlayer dielectric film includes a third silicon oxide film provided under the first silicon oxide film and defines a base layer.

16. A semiconductor device according to claim 12, wherein a wiring is formed on the interlayer dielectric film, the wiring including a barrier layer formed on surfaces of the first trough hole, the second through hole and the interlayer dielectric film, and a conductive film formed on a surface of the barrier layer.

17. A semiconductor device according to claim 16, wherein the conductive film is formed from aluminum or an alloy containing aluminum as a main component.

18. A semiconductor device according to claim 12, wherein at least a bonding pad, a power source line or a test pattern is formed in the first region, and at least a logic circuit, an analog circuit or a memory circuit is formed in the second region.

19. A semiconductor device according to claim 12, wherein a member that reduces the volume of the first through hole is formed in the first through hole.

20. A semiconductor device according to claim 12, wherein a first height of the interlayer dielectric layer is greater than a second height of the interlayer dielectric layer,
   wherein the first height of the interlayer dielectric layer is the height of the interlayer dielectric layer in the first region, and
   wherein the second height of the interlayer dielectric layer is the height of the interlayer dielectric layer in the second region.

21. A semiconductor device according to claim 12, wherein the interlayer dielectric film has a thickness in the first region that is about 90–50% of the maximum thickness over the second region.

22. A semiconductor device according to claim 12, wherein the step difference in the interlayer dielectric film between the first region and the second region is caused by the first wiring.

23. A semiconductor device, comprising:
   a semiconductor substrate having a main surface including a first region and a second region;
   a first wiring disposed at least partly above the main surface of the semiconductor substrate; and
   an interlayer dielectric film formed over the first region and the second region,
   wherein the interlayer dielectric film defines a first through hole over the first wiring and a second through hole over the second region,
   wherein the first through hole has a first aperture area and the second through hole has a second aperture area,
   wherein the first aperture area is greater than the second aperture area,
   wherein the interlayer dielectric film has a first height in the first region and a second height in the second region, wherein the first height is greater than the second height,
   wherein the area of the first aperture and the area of the second aperture are determined by the first height and the second height, respectively.

24. A semiconductor device according to claim 23, wherein the interlayer dielectric film includes a first silicon oxide film that is formed by polycondensation reaction between a silicon compound and hydrogen peroxide.

25. A semiconductor device according to claim 24, wherein the interlayer dielectric film includes a third silicon oxide film provided under the first silicon oxide film and defines a base layer.

26. A semiconductor device according to claim 23, wherein the interlayer dielectric film includes a second silicon oxide film at is provided over the first silicon oxide film and defines a cap layer.

27. A semiconductor device according to claim 23, wherein a wiring is formed on the interlayer dielectric film, the wiring including a barrier layer formed on surfaces of the first through hole, the second through hole and the interlayer dielectric film, and a conductive film formed on a surface of the barrier layer.

28. A semiconductor device according to claim 27, wherein the conductive film is formed from aluminum or an alloy containing aluminum as a main component.

29. A semiconductor device according to claim 23, wherein a member that reduces the volume of the first through hole is formed in the first through hole.

30. A semiconductor device according to claim 23, wherein the interlayer dielectric film has a thickness in the first region that is about 90–50% of the maximum thickness over the second region.

31. A semiconductor device, comprising:
a semiconductor substrate having main surface including a first region and a second region;
a first metal wiring above the semiconductor substrate in the first region; and
an interlayer dielectric film formed over the first metal wiring and the first region and over the second region and defining a first through hole over the first metal wiring and a second through hole over the second region,
wherein the interlayer dielectric film has a maximum thickness over the first region, and
wherein an aperture area of the first through hole is greater than an aperture area of the second through hole.

32. A semiconductor device according to claim 31, wherein the interlayer dielectric film includes a first silicon oxide film that is formed by polycondensation reaction between a silicon compound and hydrogen peroxide.

33. A semiconductor device according to claim 32, wherein the interlayer dielectric film includes a second silicon oxide film that is provided over the first silicon oxide film and defines a cap layer.

34. A semiconductor device according to claim 33, wherein the interlayer dielectric film includes a third silicon oxide film provided under the first silicon oxide film and defines a base layer.

35. A semiconductor device according to claim 31, wherein a wiring is formed on the interlayer dielectric film, the wiring including a barrier layer formed on surfaces of the first through hole, the second through hole and the interlayer dielectric film and a conductive film formed on a surface of the barrier layer.

36. A semiconductor device according to claim 35, wherein the conductive film is formed from aluminum or an alloy containing aluminum as a main component.

37. A semiconductor device according to claim 31, wherein at least a bonding pad, a power source line or a test pattern is formed in the first region, and at least a logic circuit, an analog circuit or a memory circuit is formed in the second region.

38. A semiconductor device according to claim 31, wherein a member that reduces the volume of the first through hole is formed in the first through hole.

39. A semiconductor device, comprising:
a semiconductor substrate having main surface including a first region and a second region;
a first wiring above the semiconductor substrate in the first region; and
an interlayer dielectric film formed in direct contact with the first wiring and over the first region and over the second region and defining a first through hole over the first wiring and a second through hole over the second region,
wherein the interlayer dielectric film has a maximum thickness over the first region, and
wherein an aperture area of the first through hole is greater than an aperture area of the second through hole.

40. A semiconductor device according to claim 39, wherein the first wiring including a metal wiring.

41. A semiconductor device according to claim 39, wherein the interlayer dielectric film includes a first silicon oxide film that is formed by polycondensation reaction between a silicon compound and hydrogen peroxide.

42. A semiconductor device according to claim 41, wherein the interlayer dielectric film includes a second silicon oxide film that is provided over the first silicon oxide film and defines a cap layer.

43. A semiconductor device according to claim 42, wherein the interlayer dielectric film includes a third silicon oxide film provided under the first silicon oxide film and defines a base layer.

44. A semiconductor device according to claim 39, wherein a wiring is formed on the interlayer dielectric film, the wiring including a barrier layer formed on surfaces of the first through hole, the second through hole and the interlayer dielectric film, and a conductive film formed on a surface of the barrier layer.

45. A semiconductor device according to claim 44, wherein the conductive film is formed from aluminum or an alloy containing aluminum as a main component.

46. A semiconductor device according to claim 39, wherein at least a bonding pad, a power source line or a test pattern is formed in the first region, and at least a logic circuit, an analog circuit or a memory circuit is formed in the second region.

47. A semiconductor device according to claim 39, wherein a member that reduces the volume of the first through hole is formed in the first through hole.

48. A semiconductor device, comprising:
a semiconductor substrate having main surface including a first region and a second region;
a first metal wiring above the semiconductor substrate in the first region;
a second metal wiring above the semiconductor substrate in the second region;
an interlayer dielectric film formed over the first metal wiring and the first region and over the second metal wiring and the second region,
wherein interlayer dielectric film defines a first through hole over the first metal wiring and a second through hole over the second metal wiring,
wherein the interlayer dielectric film has a maximum thickness over the first region,
wherein the first through hole has an aperture area and the second through hole has a second aperture area, and
wherein the first aperture area is greater than the second aperture area.

49. A semiconductor device according to claim 48, wherein the first wiring area is greater than the second wiring area.

50. A semiconductor device according to claim 48, wherein the interlayer dielectric film includes a first silicon oxide film that is formed by polycondensation reaction between a silicon compound and hydrogen peroxide.

51. A semiconductor device according to claim 50, wherein the interlayer dielectric film includes a second silicon oxide film that is provided over the first silicon oxide film and defines a cap layer.

52. A semiconductor device according to claim 51, wherein the interlayer dielectric film includes a third silicon oxide film provided under the first silicon oxide film and defines a base layer.

53. A semiconductor device according to claim 48, wherein a wiring is formed on the interlayer dielectric film, the wiring including a barrier layer formed on surfaces of the first through hole, the second through hole and the interlayer dielectric film, and a conductive film formed on a surface of the barrier layer.

54. A semiconductor device according to claim 53, wherein the conductive film is formed from aluminum or an alloy containing aluminum as a main component.

55. A semiconductor device according to claim 48, wherein at least a bonding pad, a power source line or a test pattern is formed in the first region, and at least a logic circuit, an analog circuit or a memory circuit is formed in the second region.

56. A semiconductor device according to claim 48, wherein a member that reduces the volume of the first through hole is formed in the first through hole.

57. A semiconductor device, comprising:
   a semiconductor substrate having main surface including a first region and a second region;
   a first wiring above the semiconductor substrate in the first region;
   a second wiring above the semiconductor substrate in the second region;
   an interlayer dielectric film formed in direct contact with the first wiring and over the first region and in direct contact with the second wiring and over the second region,
   wherein interlayer dielectric film defines a first through hole over the first wiring and a second through hole over the second wiring,
   wherein the interlayer dielectric film has a maximum thickness over the first region,
   wherein the first through hole has an aperture area and the second through hole has a second aperture area, and
   wherein the first aperture area is greater than the second aperture area.

58. A semiconductor device according to claim 57, wherein the first wiring and the second wiring including a metal wiring.

59. A semiconductor device according to claim 58, wherein the first wiring area is greater than the second wiring area.

60. A semiconductor device according to claim 57, wherein the first wiring area is greater than the second wiring area.

61. A semiconductor device according to claim 57, wherein the interlayer dielectric film includes a first silicon oxide film that is formed by polycondensation reaction between a silicon compound and hydrogen peroxide.

62. A semiconductor device according to claim 61, wherein the interlayer dielectric film includes a second silicon oxide film that is provided over the first silicon oxide film and defines a cap layer.

63. A semiconductor device according to claim 62, wherein the interlayer dielectric film includes a third silicon oxide film provided under the first silicon oxide film and defines a base layer.

64. A semiconductor device according to claim 57, wherein a wiring is formed on the interlayer dielectric film, the wiring including a barrier layer formed on surfaces of the first through hole, the second through hole and the interlayer dielectric film, and a conductive film formed on a surface of the barrier layer.

65. A semiconductor device according to claim 64, wherein the conductive film is formed from aluminum or an alloy containing aluminum as a main component.

66. A semiconductor device according to claim 57, wherein at least a bonding pad, a power source line or a test pattern is formed in the first region, and at least a logic circuit, an analog circuit or a memory circuit is formed in the second region.

67. A semiconductor device according to claim 57, wherein a member that reduces the volume of the first through hole is formed in the first through hole.

* * * * *